(12) United States Patent
Aoki et al.

(10) Patent No.: US 12,308,358 B2
(45) Date of Patent: May 20, 2025

(54) DISPLAY DEVICE

(71) Applicant: Japan Display Inc., Tokyo (JP)

(72) Inventors: Yoshinori Aoki, Tokyo (JP); Yasuhiro Kanaya, Tokyo (JP); Masanobu Ikeda, Tokyo (JP); Akihiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 308 days.

(21) Appl. No.: 17/750,489

(22) Filed: May 23, 2022

(65) Prior Publication Data

US 2022/0285332 A1  Sep. 8, 2022

Related U.S. Application Data

(63) Continuation of application No. PCT/JP2020/039265, filed on Oct. 19, 2020.

(30) Foreign Application Priority Data

Nov. 25, 2019 (JP) .................. 2019-212184

(51) Int. Cl.
| | | |
|---|---|---|
| *H01L 33/36* | (2010.01) | |
| *H01L 25/16* | (2023.01) | |

(Continued)

(52) U.S. Cl.
CPC ........... *H01L 25/167* (2013.01); *H10H 20/83* (2025.01); *H10H 20/857* (2025.01); *G09G 3/32* (2013.01);

(Continued)

(58) Field of Classification Search
CPC ............................... H01L 33/38; H01L 33/62
See application file for complete search history.

(56) References Cited

U.S. PATENT DOCUMENTS 10,021,762 B1 * 7/2018 Tsai ..................... H10K 59/124
10,971,480 B2 * 4/2021 Wang .................... H10D 86/60
(Continued)

FOREIGN PATENT DOCUMENTS

| | | |
|---|---|---|
| JP | 2018-534614 A | 11/2018 |
| WO | 2017127563 A1 | 7/2017 |

OTHER PUBLICATIONS

English translation of the Office Action dated Sep. 25, 2023 for the corresponding DE Patent Application No. 11 2020 005 137.4.

(Continued)

*Primary Examiner* — Evren Seven
(74) *Attorney, Agent, or Firm* — Michael Best & Friedrich LLP

(57) ABSTRACT

According to one embodiment, a display device includes pixels each including transistors, pixel electrodes, a contact electrode, and light emitting elements, and an insulating basement, a first organic insulating layer, a second organic insulating layer, a resin layer, a common electrode, and first wiring lines. The common electrode is electrically connected to cathodes of the light emitting elements, and electrically connected to the contact electrodes of the pixels. The first wiring lines, each provided between the first organic insulating layer and the second organic insulating layer or between the second organic insulating layer and the resin layer, are electrically connected to the contact electrodes of the pixels, and are formed of a metal.

12 Claims, 13 Drawing Sheets

(51) Int. Cl.
   H01L 33/62   (2010.01)
   H10H 20/83   (2025.01)
   H10H 20/857  (2025.01)
   *G09G 3/32*      (2016.01)

(52) U.S. Cl.
   CPC ............... *G09G 2300/0426* (2013.01); *G09G 2300/0443* (2013.01); *G09G 2300/0842* (2013.01); *G09G 2310/0267* (2013.01)

(56) References Cited

U.S. PATENT DOCUMENTS

| | | | | |
|---|---|---|---|---|
| 2014/0267683 | A1* | 9/2014 | Bibl | .......................... H01L 24/75 348/87 |
| 2015/0349205 | A1* | 12/2015 | Chen | .................. H10H 20/8162 257/99 |
| 2016/0118457 | A1 | 4/2016 | Kim | |
| 2019/0075633 | A1 | 3/2019 | Tsai et al. | |
| 2019/0181301 | A1* | 6/2019 | Kim | .......................... H01L 33/20 |
| 2019/0214376 | A1* | 7/2019 | Kim | ...................... H01L 33/504 |
| 2019/0310514 | A1 | 10/2019 | Kim et al. | |
| 2020/0212102 | A1* | 7/2020 | Park | ...................... H10H 20/821 |
| 2022/0077227 | A1* | 3/2022 | Kang | ........................ G09G 3/32 |

OTHER PUBLICATIONS

International Search Report mailed on Dec. 28, 2020, for the corresponding PCT Application No. PCT/JP2020/039265, with English machine translation.

Japanese Office Action dated Jul. 2, 2024, for the corresponding Japanese Patent Application No. 2023-186563, with English machine translation.

* cited by examiner

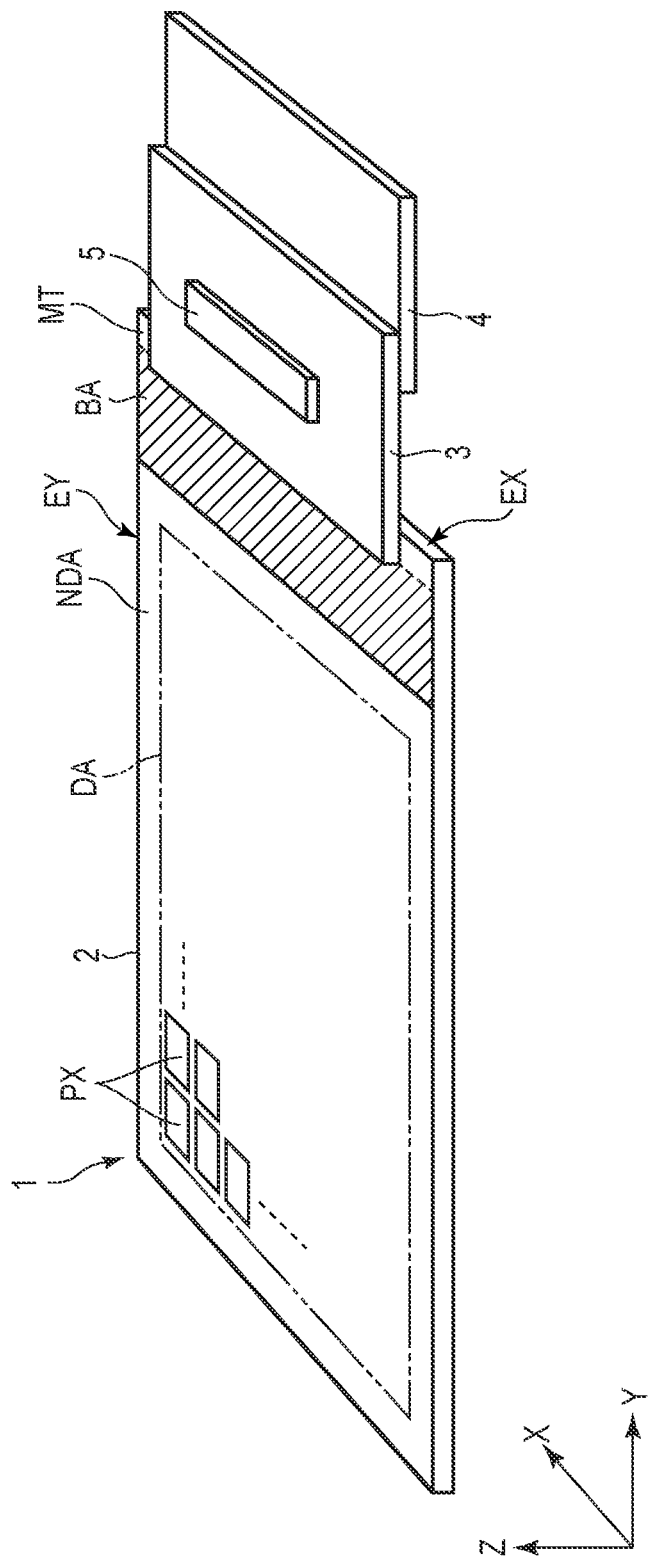
F I G. 1

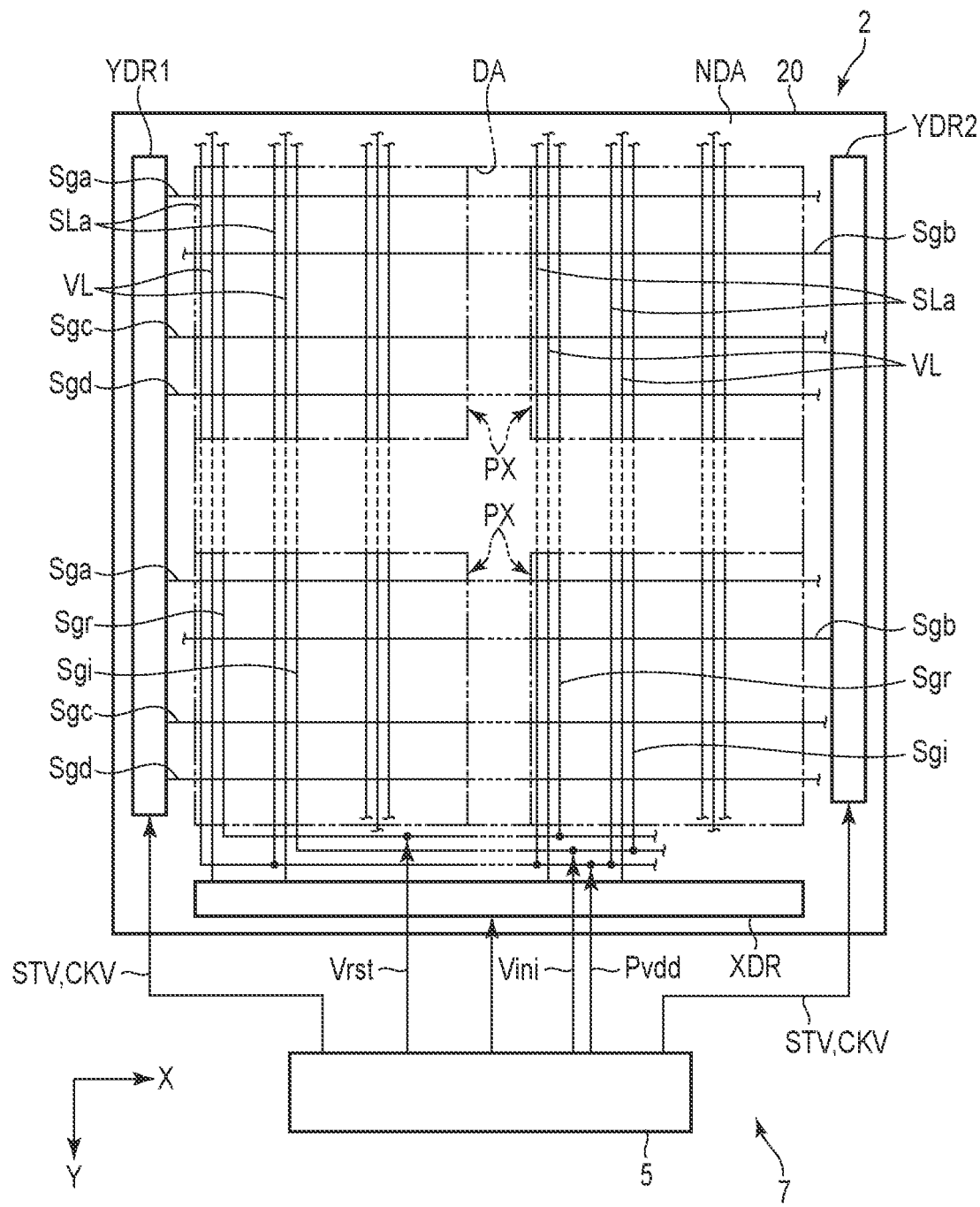
F I G. 2

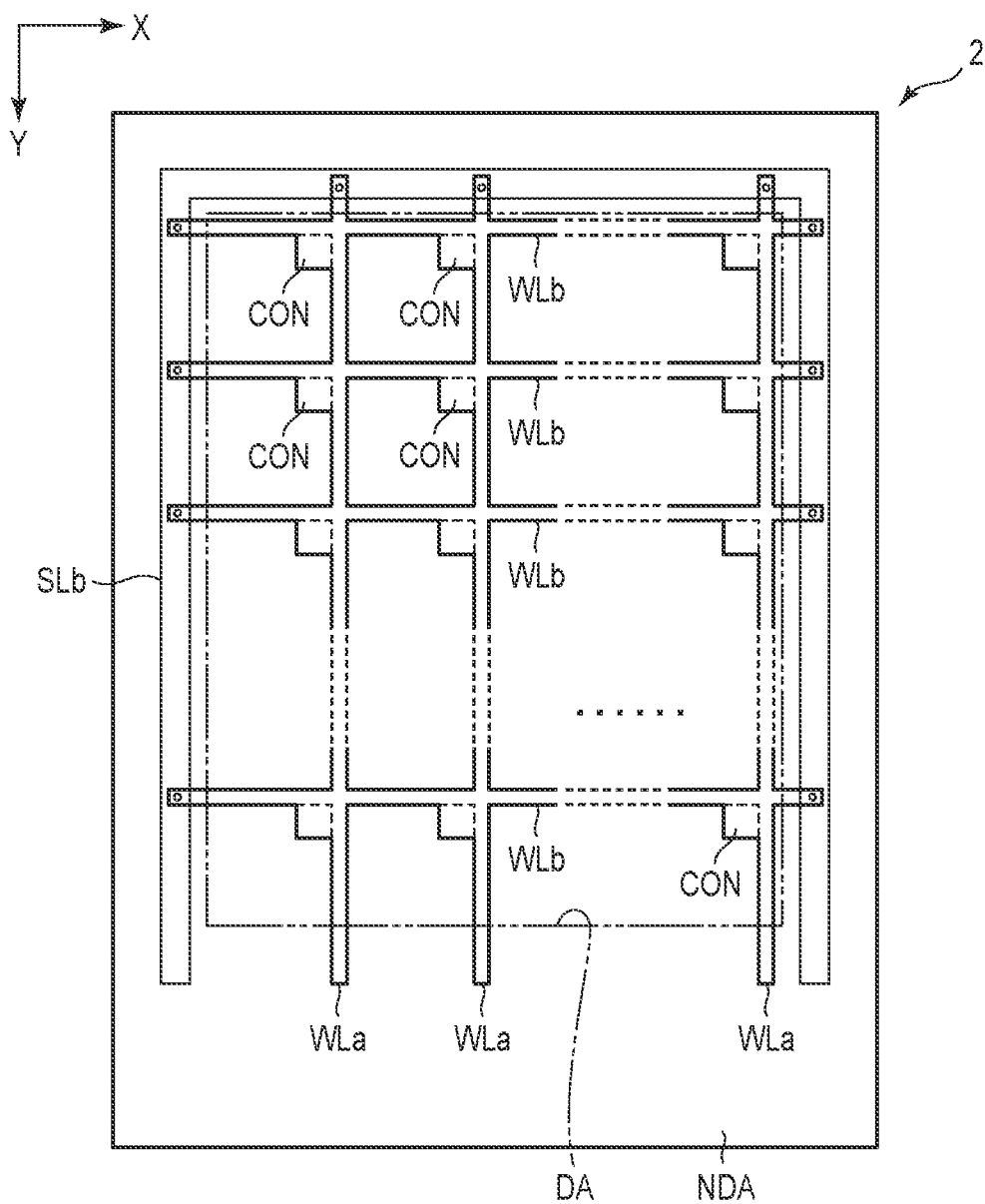
F I G. 9

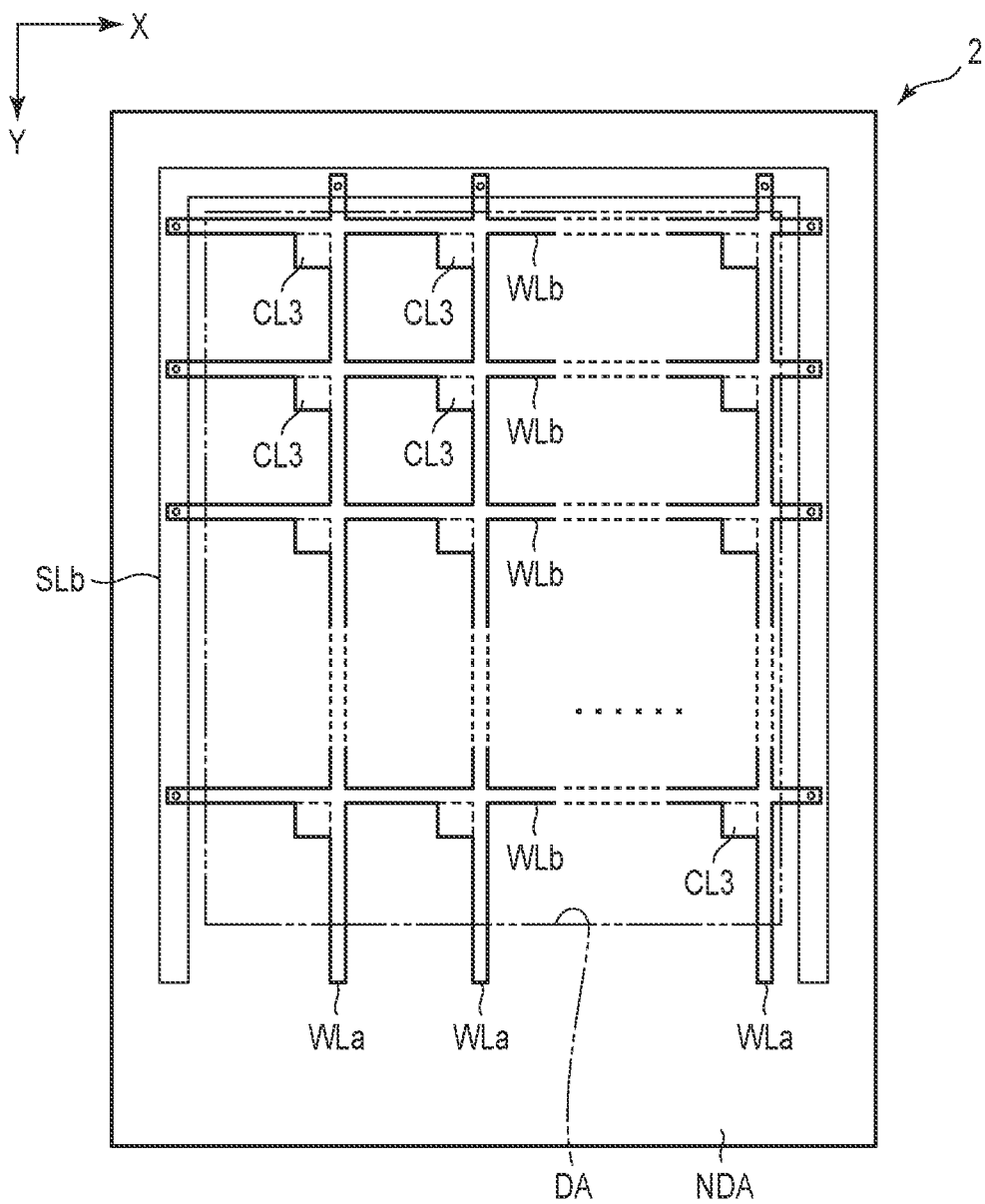
F I G. 13

DISPLAY DEVICE

CROSS-REFERENCE TO RELATED APPLICATIONS

This application is a Continuation Application of PCT Application No. PCT/JP2020/039265, filed Oct. 19, 2020 and based upon and claiming the benefit of priority from Japanese Patent Application No. 2019-212184, filed Nov. 25, 2019, the entire contents of all of which are incorporated herein by reference.

FIELD

Embodiments described herein relate generally to a display device.

BACKGROUND

LED display panels using light emitting diodes (LED) that are self-luminous light-emitting elements are known as display panels. Recently, a display panel (hereinafter referred to as a micro-LED display panel) in which minute light-emitting diodes referred to as micro-LED are mounted on an array substrate has been developed as a higher definition display panel.

Since the micro-LED display is formed such that a large number of chip-like micro-LED are mounted in a display area, unlike the liquid crystal display or organic EL display, both higher definition and larger scale of the display can easily be achieved and the display is focused as a next generation display panel.

BRIEF DESCRIPTION OF THE DRAWINGS

FIG. 1 is a perspective view showing a structure of a display device according to a first embodiment.

FIG. 2 is a circuit diagram showing the display device.

FIG. 9 is a plan view showing the display panel according to modified example 1 of the first embodiment, illustrating a second power line and a plurality of wiring lines.

FIG. 13 is a plan view showing the display panel according to the second embodiment, illustrating a second power line, a plurality of conductive layers, and a plurality of wiring lines.

DETAILED DESCRIPTION

Figure 3:
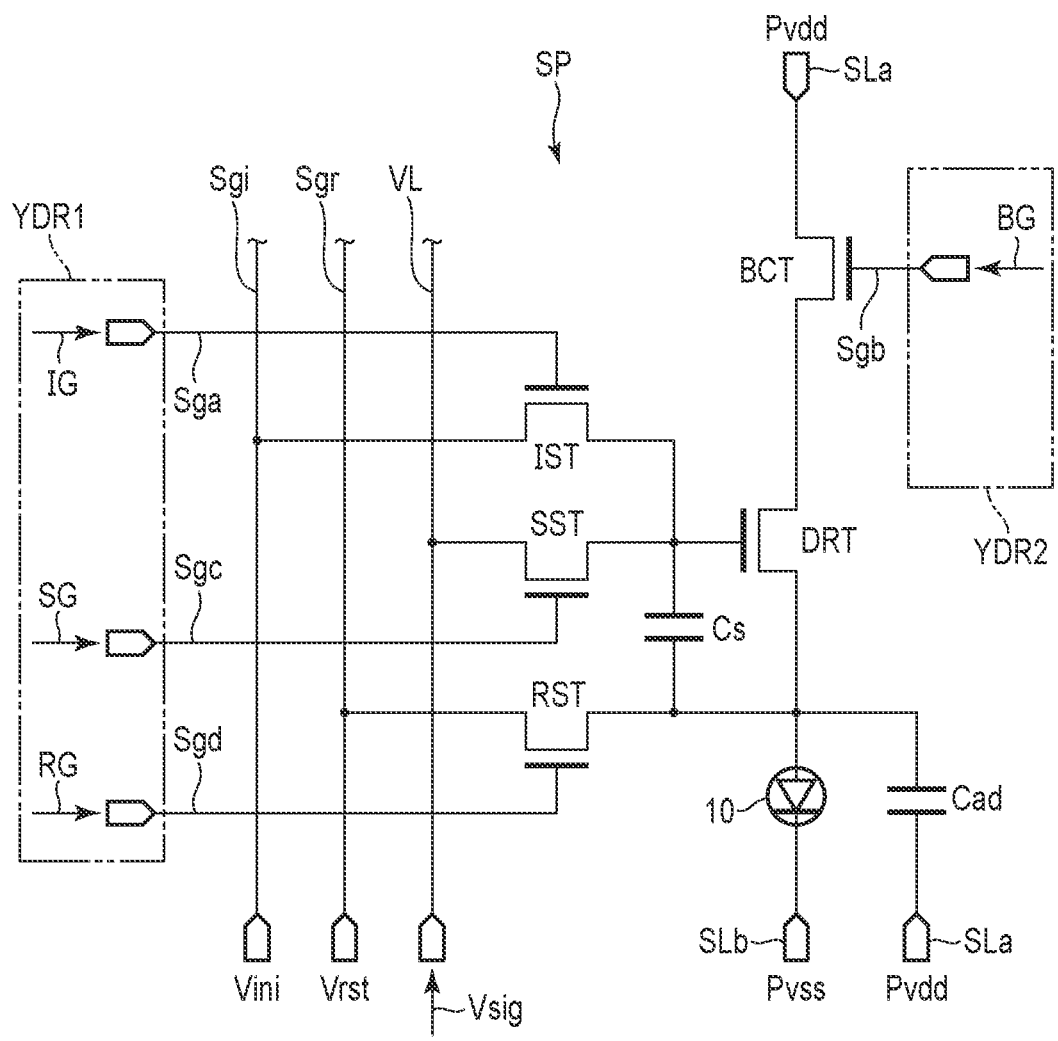
FIG. 3 is an equivalent circuit diagram showing a subpixel of the first embodiment.

In general, according to one embodiment, there is provided a display device comprising: a plurality of pixels each including a plurality of transistors, a plurality of pixel electrodes, a contact electrode, and a plurality of light emitting elements; an insulating basement; a first organic insulating layer provided above the insulating basement to cover the transistors; a second organic insulating layer provided above the first organic insulating layer; a resin layer provided on the second organic insulating layer; a common electrode disposed on the resin layer; and a plurality of first wiring lines. The plurality of pixel electrodes and the contact electrode are provided between the second organic insulating layer and the resin layer. Each of the light emitting elements includes a first polar electrode located on a surface opposed to a corresponding pixel electrode of the plurality of pixel electrodes and electrically connected to the pixel electrode, and a second polar electrode located on a surface opposite to the surface where the first polar electrode is located. The second polar electrode of each of the light emitting elements is exposed from the resin layer. The common electrode is electrically connected to the second polar electrodes of the plurality of light emitting elements, and is electrically connected to the contact electrodes of the plurality of pixels through the plurality of first contact holes formed in the resin layer. The plurality of first wiring lines, are each provided between the first organic insulating layer and the second organic insulating layer or between the second organic insulating layer and the resin layer, are electrically connected to the contact electrodes of the plurality of pixels, and are formed of a metal.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

First, a display device according to a first embodiment will be described. FIG. 1 is a perspective view showing a configuration of a display device 1 according to the present embodiment. FIG. 1 illustrates a three-dimensional space which is defined by a first direction X, a second direction Y orthogonal to the first direction X, and a third direction Z orthogonal to the first direction X and the second direction Y. The first direction X and the second direction Y are orthogonal to each other, but may intersect at an angle other than 90 degrees. In addition, the third direction Z is defined as an upward direction and a direction opposite to the third direction Z is defined as a downward direction, in the present embodiment. Expressions such as "a second component above a first component" and "a second component below a first component" mean that the second component may be in contact with the first component or may be located separately from the first component.

In the present embodiment, an example where the display device 1 is a micro-LED display device using a micro-light emitting diode [hereinafter referred to as a micro-light emitting diode (micro-LED), which is a self-luminous light emitting element] will be mainly described below.

As shown in FIG. 1, the display device 1 comprises a display panel 2, a first circuit board 3, a second circuit board 4, and the like.

The display panel 2 has, for example, a rectangular shape. In the example illustrated, shorter sides EX of the display panel 2 are parallel to the first direction X, and longer sides EY of the display panel 2 are parallel to the second direction Y. The third direction Z corresponds to a thickness direction of the display panel 2. The main surface of the display panel 2 is parallel to an X-Y plane defined by the first direction X and the second direction Y. The display panel 2 has a display area DA and a non-display area NDA other than the display area DA. In the example illustrated, the non-display area NDA is an area outside the display area DA and surrounds the display area DA. The non-display area NDA includes a terminal area MT.

The display area DA is an area where images are displayed and, for example, a plurality of pixels PX are arrayed in a matrix in the first direction X and the second direction Y in the display area DA. In the present embodiment, the shape of the display area DA is a quadrangle, but the shape is not limited to this but may be a polygon other than the quadrangle, a circle, or the like. In addition, the size of the display area DA is larger than the size of the non-display area NDA but is not limited to this, and the size of the display area DA may be smaller than the size of the non-display area NDA.

The terminal area MT is provided along the shorter sides EX of the display panel 2, and includes terminals to electrically connect the display panel 2 to external devices and the like.

The first circuit board 3 is mounted on the terminal area MT and is electrically connected to the display panel 2. The first circuit board 3 is, for example, a flexible printed circuit (FPC). The first circuit board 3 comprises a driver IC chip (hereinafter referred to as a panel driver) 5 which drives the display panel 2, and the like. In the example illustrated, the panel driver 5 is mounted on the first circuit board 3 but may be mounted under the first circuit board 3. Alternatively, the panel driver 5 may be mounted on a part other than the first circuit board 3, for example, the display panel 2 or the second circuit board 4. The second circuit board 4 is, for example, a printed circuit board (PCB). The second circuit board 4 is connected to the first circuit board 3, for example, below the first circuit board 3.

The above panel driver 5 is connected to a control board (not shown) via, for example, the second circuit board 4. For example, the panel driver 5 performs control of displaying an image on the display panel 2 by driving a plurality of pixels PX, based on a video signal output from the control board.

The display panel 2 may include a fold area BA represented by hatch lines. The fold area BA corresponds to an area which is folded when the display device 1 is accommodated in a housing. The fold area BA is located on the terminal area MT side of the non-display area NDA. In a state in which the fold area BA is folded, the first circuit board 3 and the second circuit board 4 are disposed below the display panel 2 to be opposed to the display panel 2.

FIG. 2 is a circuit diagram showing the display device 1. FIG. 3 is an equivalent circuit diagram showing a sub-pixel SP of the present embodiment. In FIG. 2, not all of the various lines are shown.

As shown in FIG. 2 and FIG. 3, the display panel 2 comprises an insulating basement (insulating substrate) 20 having a light transmitting property, a plurality of pixels PX arrayed in a matrix on the insulating substrate 20 in the display area DA, various lines, scanning line driving circuits YDR1 and YDR2, and a signal line driving circuit XDR.

Various lines include a plurality of first scanning lines Sga, a plurality of second scanning lines Sgb, a plurality of third scanning lines Sgc, a plurality of fourth scanning lines Sgd, a plurality of video signal lines VL, a plurality of first power lines SLa, a plurality of reset lines Sgr, and a plurality of initialization lines Sgi.

In the present embodiment, the first scanning lines Sga, the third scanning lines Sgc, and the fourth scanning lines Sgd are connected to the scanning line driving circuit YDR1 and provided to extend in the first direction X. The second scanning lines Sgb are connected to the scanning line driving circuit YDR2 and are provided to extend in the first direction X. The video signal lines VL are connected to the signal line driving circuit XDR and are provided to extend in the second direction Y. The first power lines SLa, the reset lines Sgr, and the initialization lines Sgi are provided to extend in the second direction Y.

For example, the plurality of first power lines SLa are located in the display area DA and are arranged at intervals in the first direction X. The display panel 2 includes not only the first power lines SLa, but also the second power line SLb set to a potential different from that of the first power lines SLa. In the present embodiment, the first power lines SLa are high potential power lines fixed to a high potential Pvdd, and the second power line SLb is low potential power lines fixed to a low potential Pvss. The first power lines SLa are connected to a high potential power supply, and the second power lines SLb are connected to a low potential power supply.

The scanning line driving circuit YDR1 is configured to drive the first scanning lines Sga, the third scanning lines Sgc, and the fourth scanning lines Sgd. The scanning line driving circuit YDR2 is configured to drive the second scanning lines Sgb. The signal line driving circuit XDR is configured to drive the video signal lines VL. The scanning line driving circuits YDR1 and YDR2 and the signal line driving circuit XDR are formed on the insulating basement 20 in the non-display area NDA and constitutes a driver 7 together with the panel driver 5.

Each of the pixels PX includes a plurality of sub-pixels SP. Each of the sub-pixels SP includes the light emitting element 10 and a pixel circuit that supplies a drive current to the light emitting element 10. The light emitting element 10 is, for example, a self-luminous element, and is a micro-light-emitting diode (hereinafter referred to as a micro-LED [Light Emitting Diode]) in the present embodiment. The display device 1 of the present embodiment is a micro-LED display device.

The pixel circuit of each sub-pixel SP is a voltage signal type pixel circuit that controls the light emission of the light emitting element 10 in accordance with the video signal Vsig formed of a voltage signal, and includes a reset switch RST, a pixel switch SST, an initialization switch IST, an output switch BCT, a drive transistor DRT, a storage capacitor Cs, and an auxiliary capacitor Cad. The storage capacitor Cs and the auxiliary capacitor Cad are capacitors. The auxiliary capacitor Cad is an element provided to adjust the amount of a light emission current and may be unnecessary in some cases.

The reset switch RST, the pixel switch SST, the initialization switch IST, the output switch BCT, and the drive transistor DRT are composed of thin-film transistors (TFTs). In the present embodiment, the reset switch RST, the pixel switch SST, the initialization switch IST, the output switch BCT, and the drive transistor DRT are composed of TFTs of the same conductivity type, for example, N-channel type. One or more of the reset switch RST, the pixel switch SST, the initialization switch IST, the output switch BCT, and the drive transistor DRT may be composed of P-channel TFTs. In this case, N-channel TFTs and P-channel TFTs may be formed at the same time. The reset switch RST, the pixel switch SST, the initialization switch IST, and the output switch BCT need only to function as switches, and may not be composed of TFTs.

In the display device 1 according to the present embodiment, all of the TFTs that constitute the drive transistors DRT and switches, respectively, are top-gate thin-film transistors formed in the same processes with the same layer structure and using polycrystalline silicon for the semiconductor layer. The semiconductor layer may use a semiconductor other than polycrystalline silicon, such as amorphous silicon or an oxide semiconductor.

Each of the reset switch RST, the pixel switch SST, the initialization switch IST, the output switch BCT, and the drive transistor DRT includes a first terminal, a second terminal, and a control terminal. In the present embodiment, the first terminal is used as a source electrode, the second terminal is used as a drain electrode, and the control terminal is used as a gate electrode.

In the pixel circuit of the pixel PX, the drive transistor DRT and the output switch BCT are connected in series with the light emitting element 10 at positions between the first power line SLa and the second power line SLb. The first power line SLa (high potential Pvdd) is set to a potential of, for example, 10 V, and the second power line SLb (low potential Pvss) is set to a potential of, for example, 1.5 V.

In the output switch BCT, a drain electrode is connected to the first power line SLa, a source electrode is connected to the drain electrode of the drive transistor DRT, and a gate electrode is connected to the second scanning line Sgb. The output switch BCT is thereby controlled to be on (conductive state) or off (non-conductive state) by a control signal BG supplied to the second scanning line Sgb. The output switch BCT controls the light emission time of the light emitting element 10 in response to the control signal BG.

In the drive transistor DRT, a drain electrode is connected to the source electrode of the output switch BCT, and a source electrode is connected to one of electrodes (in this example, an anode) of the light emitting element 10. The other electrode (in this example, a cathode) of the light emitting element 10 is connected to the second power line SLb. The drive transistor DRT outputs a drive current having a current amount corresponding to the video signal Vsig to the light emitting element 10.

In the pixel switch SST, a source electrode is connected to the video signal line VL, a drain electrode is connected to the gate electrode of the drive transistor DRT, and a gate electrode is connected to the third scanning line Sgc that functions as a gate line for signal write control. The pixel switch SST is controlled to be on and off by a control signal SG supplied from the third scanning line Sgc. Then, the pixel switch SST controls connection and disconnection between the pixel circuit and the video signal line VL and takes an image signal Vsig from the video signal line VL into the pixel circuit, in response to the control signal SG.

In the initialization switch IST, a source electrode is connected to the initialization line Sgi, a drain electrode is connected to the gate electrode of the drive transistor DRT, and a gate electrode is connected to the first scanning line Sga. The initialization switch IST is controlled to be on and off by a control signal IG supplied from the first scanning line Sga. Then, the initialization switch IST controls connection and disconnection between the pixel circuit and the initialization line Sgi in response to the control signal IG. An initialization potential (initialization voltage) Vini can be taken into the pixel circuit from the initialization line Sgi by connecting the pixel circuit with the initialization line Sgi by the initialization switch IST.

The reset switch RST is connected between the source electrode of the drive transistor DRT and the reset line Sgr. The gate electrode of the reset switch RST is connected to the fourth scanning line Sgd that functions as a reset control gate line. As described above, the reset line Sgr is connected to a reset power supply and fixed to a reset potential Vrst that is a constant potential. The reset switch RST is switched to a conductive state (on) or a non-conductive state (off) in response to the control signal RG supplied through the fourth scanning line Sgd. When the reset switch RST is switched to be the on state, the potential of the source electrode of the drive transistor DRT can be reset to the reset potential Vrst.

The storage capacitor Cs is electrically connected between the gate electrode and the source electrode of the drive transistor DRT. The auxiliary capacitor Cad is connected between the source electrode of the drive transistor DRT and the first power line SLa serving as a constant potential line.

In contrast, the panel driver 5 shown in FIG. 2 controls the scanning line driving circuits YDR1 and YDR2 and the signal line driving circuit XDR. The panel driver 5 receives a digital video signal and a synchronization signal supplied from the outside, and generates a vertical scanning control signal for controlling vertical scanning timing and a horizontal scanning control signal for controlling horizontal scanning timing, based on the synchronization signal.

Then, the panel driver 5 supplies the vertical scanning control signal and the horizontal scanning control signal to each of the scanning line driving circuits YDR1 and YDR2 and the signal line driving circuit XDR, and supplies the digital video signal and the initialization signal to the signal line driving circuit XDR in synchronization with the horizontal and vertical scanning timing.

The signal line driving circuit XDR converts digital video signals sequentially obtained in each horizontal scanning period under the control of the horizontal scanning control signal into an analog format, and supplies video signals Vsig corresponding to the gradation to a plurality of video signal lines VL. The panel driver 5 fixes the first power line SLa to the high potential Pvdd, fixes the reset line Sgr to the reset potential Vrst, and fixes the initialization line Sgi to the initialization potential Vini. The potential of the first power line SLa, the potential of the reset line Sgr, and the potential of the initialization line Sgi may be set via the signal line driving circuit XDR.

A start pulse signal STV, a clock signal CKV, and the like are supplied to the scanning line driving circuits YDR1 and YDR2 by the panel driver 5.

The scanning line driving circuits YDR1 and YDR2 include a shift register, an output buffer, and the like (not shown), sequentially transfer the start pulse signal STV to the shift register of the next stage, and supplies four types of control signals, i.e., control signals IG, BG, SG, and RG to the sub-pixels SP of each row via the output buffer. The first scanning line Sga, the second scanning line Sgb, the third scanning line Sgc, and the fourth scanning line Sgd are thereby driven by the control signals IG, BG, SG, and RG, respectively.

The circuit configuration of the sub-pixel SP described with reference to FIG. 3 is an example, and the circuit configuration of the sub-pixel SP may be the other configuration as long as it includes at least the drive transistor DRT and the light emitting element 10. For example, several elements in the circuit configuration of the sub-pixel SP described with reference to FIG. 3 may be omitted, or other elements may be added.

Figure 4:
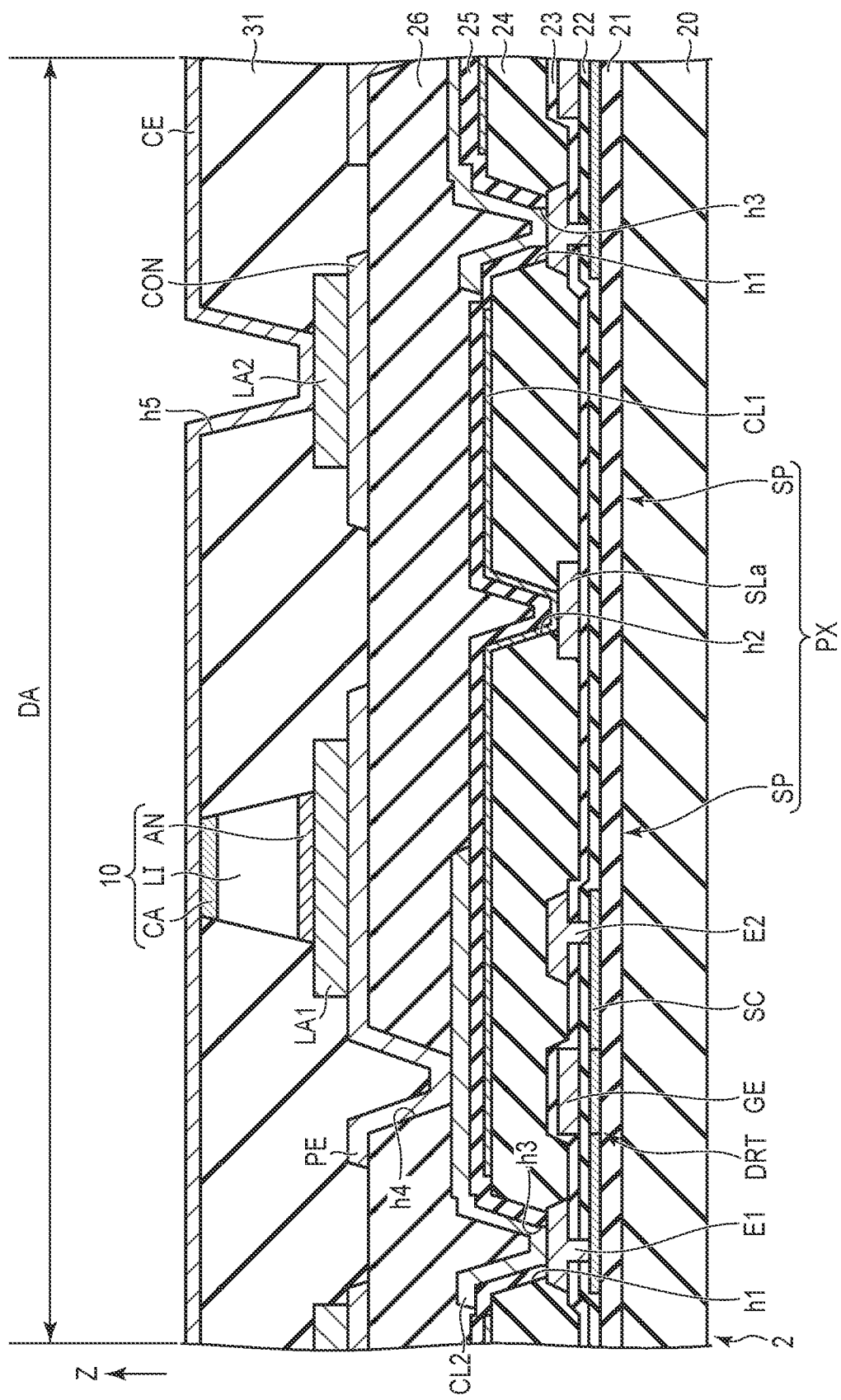
FIG. 4 is a partially sectional view showing a display panel shown in FIG. 1.

Next, the structures of the drive transistor DRT, the pixel electrode PE, the light emitting element 10, the common electrode CE, and the like will be described with reference to FIG. 4. FIG. 4 is a partially sectional view showing the display panel 2 shown in FIG. 1. In FIG. 4, the display panel 2 is illustrated such that the display surface, i.e., the light emission surface faces upward and the back surface faces downward.

As shown in FIG. 4, the display panel 2 comprises an insulating basement 20, insulating layers 21, 22, 23, 24, 25, and 26 provided on the insulating basement 20, and a plurality of pixels PX. The plurality of pixels PX are provided on the insulating basement 20, are located in the display area DA, and include sub-pixels SP of a plurality of colors.

A glass substrate of quartz, alkali-free glass, and the like or a resin substrate of polyimide, and the like can be mainly used as the insulating basement 20. The material of the insulating basement 20 may be a material withstanding a processing temperature during manufacturing the TFT. When the insulating basement 20 is a flexible resin substrate, the display device 1 can be constituted as a sheet display. As the resin substrate, not only polyimide, but the other resin material may be used. When polyimide or the like is used for the insulating basement 20, the insulating basement 20 may be referred to as an organic insulating layer or a resin layer, more appropriately.

The insulating layer 21 is provided on the insulating basement 20. Various TFTs are formed on the insulating layer 21. In the display area DA, the drive transistor DRT and the like is formed on the insulating layer 21. The TFT such as the drive transistor DRT comprises a semiconductor layer SC, a gate electrode GE, a first electrode E1, and a second electrode E2.

The semiconductor layer SC is disposed on the insulating layer 21. The insulating layer 22 is provided on the insulating layer 21 and the semiconductor layer SC. The gate electrode GE is disposed on the insulating layer 22 and is opposed to the channel region of the semiconductor layer SC. The insulating layer 23 is provided on the insulating layer 22 and the gate electrode GE. The first electrode E1 and the second electrode E2 are disposed on the insulating layer 23. The first electrode E1 and the second electrode E2 pass through contact holes formed in the insulating layer 22 and the insulating layer 23, respectively, and are electrically connected to the corresponding semiconductor layer SC. In the present embodiment, the first power line SLa is further provided on the insulating layer 23.

The insulating layer 24 is provided on the insulating layer 23, the first electrode E1, the second electrode E2, and the first power line SLa. The insulating layer 24 covers a plurality of TFTs such as a plurality of drive transistors DRT. A plurality of contact holes h1 and h2 are formed in the insulating layer 24. The contact hole h1 exposes an upper surface of the first electrode E1. The contact hole h2 exposes an upper surface of the first power line SLa.

A conductive layer CL1 is provided on the insulating layer 24. The conductive layer CL1 is in contact with the first power line SLa through the contact hole h2 and is electrically connected to the first power line SLa. The conductive layer CL1 has an opening surrounding the contact hole h1.

The insulating layer 25 is provided on the insulating layer 24 and the conductive layer CL1. The insulating layer 25 has a contact hole h3 surrounded by the contact hole h1, and the contact hole h3 exposes an upper surface of the first electrode E1 together with the contact hole h1. The conductive layer CL2 is disposed on the insulating layer 25. The conductive layer CL2 is in contact with the first electrode E1 through the contact hole h3 formed in the insulating layer 25 and is electrically connected to the first electrode E1.

The insulating layer 26 is provided on the insulating layer 25 and the conductive layer CL2. A contact hole h4 is formed in the insulating layer 26, and the contact hole h4 exposes an upper surface of the conductive layer CL2.

The pixel electrode PE is disposed on the insulating layer 26. The pixel electrode PE is in contact with the conductive layer CL2 through the contact hole h4 formed in the insulating layer 26 and is electrically connected to the conductive layer CL2. The pixel electrode PE is electrically connected to the first electrode E1 of the drive transistor DRT via the conductive layer CL2. A signal whose current value is controlled is supplied to the pixel electrode PE from the drive transistor DRT.

In the present embodiment, the display panel 2 includes a contact electrode CON, a connection layer LA1, and a connection layer LA2. The contact electrode CON is provided on the insulating layer 26 and is located at an insulating distance from the pixel electrode PE. The connection layer LA1 is disposed on the pixel electrode PE. The connection layer LA1 does not overlap with the contact hole h4 in planar view. The connection layer LA2 is disposed on the contact electrode CON.

The insulating layers 21, 22, 23, 24, 25, and 26 are formed of an inorganic insulating material or an organic insulating material. In the present embodiment, the insulating layers 21, 22, 23, and 25 are formed of, for example, silicon oxide ($SiO_2$) or silicon nitride (SiN) as the inorganic insulating material.

The insulating layers 24 and 26 are formed of, for example, a resin material such as photosensitive acrylic resin as the organic insulating material. Each of the insulating layers 24 and 26 has a flat surface on a side opposed to the light emitting element 10, and functions as a flattening layer. In the present embodiment, the insulating layer 24 provided above the insulating basement 20 functions as a first organic insulating layer, and the insulating layer 26 provided above the insulating layer 24 functions as a second organic insulating layer.

The semiconductor layer SC is formed of low temperature polycrystalline silicon as polycrystalline silicon. However, the semiconductor layer SC may be formed of a semiconductor other than polycrystalline silicon, such as amorphous silicon or an oxide semiconductor. The gate electrode GE is formed of metal as a conductive material. For example, the gate electrode GE is formed of molybdenum/tungsten (MoW).

The first electrode E1, the second electrode E2, and the first power line SLa are located in the same layer and are formed of a metal as the same conductive material. For example, each of the first electrode E1, the second electrode E2, and the first power line SLa adopts a three-layer stacked structure (Ti-based/Al-based/Ti-based), and includes a lower layer formed of a metal material containing titanium (Ti) as a main component, such as Ti or an alloy containing Ti, an intermediate layer formed of a metal material containing aluminum (Al) as a main component, such as Al or an alloy containing Al, and an upper layer formed of a metal material containing Ti as a main component, such as Ti or an alloy containing Ti.

A switch such as the drive transistor DRT is provided above the insulating basement 20 and is covered with the insulating layer 24. The example of the top-gate TFT has been described, but the TFT may be a bottom-gate TFT.

The conductive layer CL1 is formed of, for example, a transparent conductive material such as indium tin oxide (ITO) or indium zinc oxide (IZO).

The conductive layer CL2, the pixel electrode PE, and the contact electrode CON are formed of metal as a conductive material. For example, the conductive layer CL2, the pixel electrode PE, and the contact electrode CON have a two-layer stacked structure, and includes a lower layer formed of a metal material containing Ti as a main component, such as Ti or an alloy containing Ti, and an upper layer formed of a metal material containing Al as a main component, such as Al or an alloy containing Al. In the conductive layer CL2, the pixel electrode PE, and the contact electrode CON, the upper layer formed of Al or an Al alloy is an uppermost layer. For example, the uppermost layer of the contact electrode CON is located on a side opposed to the common electrode CE. The connection layer LA1 is in contact with the uppermost layer of the pixel electrode PE, and the connection layer LA2 is in contact with the uppermost layer of the contact electrode CON. Desirably, the pixel electrode PE and the contact electrode CON are located in the same layer and formed of a metal as the same conductive material.

Each of the conductive layer CL2, the pixel electrode PE, and the contact electrode CON may have a single conductive layer, a three-layer stacked structure, or a two-layer stacked structure.

In the three-layer laminated structure, the conductive layer CL2, the pixel electrode PE, and the contact electrode CON are not limited to the Ti-based/Al-based/Ti-based structure, but may be the Mo-based/Al-based/Mo-based structure. In the Mo-based/Al-based/Mo-based structure, for example, the pixel electrode PE includes a lower layer formed of molybdenum (Mo) or a metal material containing Mo as a main component such as an alloy containing Mo, an intermediate layer formed of Al or a metal material containing Al as a main component such as an alloy containing Al, and an upper layer formed of Mo or a metal material containing Mo as a main component such as an alloy containing Mo.

In the two-layer laminated structure, for example, the pixel electrode PE may include a lower layer formed of Mo or a metal material containing Mo as a main component such as an alloy containing Mo, and an upper layer formed of Al or a metal material containing Al as a main component such as an alloy containing Al. The conductive layer CL2 and the pixel electrode PE may be formed of a transparent conductive material.

The connection layers LA1 and LA2 are formed of solder.

The light emitting element 10 is mounted above the pixel electrode PE in the display area DA. More specifically, the light emitting element 10 is mounted on the connection layer LA1. The light emitting element 10 includes an anode AN serving as a first polar electrode, a cathode CA serving as a second polar electrode, and an emitting layer LI which emits light. The light emitting elements 10 having emission colors of a first color, a second color, and a third color, respectively, are prepared. In the present embodiment, the first color is red (R), the second color is green (G), and the third color is blue (B).

In each of the light emitting elements 10, the anode AN is located on the surface of the side opposed to one corresponding pixel electrode PE of the plurality of pixel electrodes PE, and is electrically connected to the pixel electrode PE. In the present embodiment, the anode AN is located on the connection layer LA1 and is in contact with the connection layer LA1. In each of the light emitting elements 10, the cathode CA is located on the surface of the side opposite to the surface on which the anode AN is located. In each of the light emitting elements 10, the light emitting layer LI is located between the anode AN and the cathode CA.

A resin layer 31 is provided on the insulating layer 26, the pixel electrode PE, the contact electrode CON, the connection layer LA1, the connection layer LA2, and the light emitting element 10. The resin layer 31 is filled in the gaps between the plurality of light emitting elements 10. The resin layer 31 has a flat surface on the side opposite to the side opposed to the insulating layer 26. For this reason, the resin layer 31 is a flattening layer. The resin layer 31 exposes the surfaces of the cathodes CA of the light emitting elements 10.

Based on the above, the plurality of pixel electrodes PE and the plurality of contact electrodes CON are provided between the insulating layer 26 and the resin layer 31.

The resin layer 31 may have a thickness that does not reach the cathodes CA of the light emitting elements 10. Parts of the unevenness caused by the mounting of the light emitting elements 10 remain on the surface on which the common electrode CE is formed, but the material forming the common electrode CE may continuously cover the parts without breakage.

The common electrode CE is located in at least the display area DA and disposed on the resin layer 31 and the plurality of light emitting elements 10 to cover the plurality of light emitting elements 10. The common electrode CE is in contact with the plurality of cathodes CA and is electrically connected to the plurality of cathodes CA. The common electrode CE is shared by the plurality of sub-pixels SP.

The common electrode CE needs to be formed as a transparent electrode to extract the light emitted from the light emitting elements 10, and is formed of, for example, ITO as a transparent conductive material.

The common electrode CE is electrically connected to the contact electrodes CON of the plurality of pixels PX through a plurality of contact holes h5 formed in the resin layer 31. In the present embodiment, the common electrode CE is in contact with the connection layer LA2 of the plurality of pixels PX through the plurality of contact holes h5. Since the common electrode CE is in contact with not the contact electrode CON, but the connection layer LA2, ohmic contact can be formed between the common electrode CE and the connection layer LA2.

As described above, the display panel 2 has a structure from the insulating substrate 20 to the common electrode CE. For example, the display device 1 using the light emitting elements 10 according to the present embodiment as the display elements is constituted as described above. A cover member such as a cover glass, an optical layer such as a polarizer, a touch panel board or the like may be provided on the common electrode CE as needed.

Figure 5:
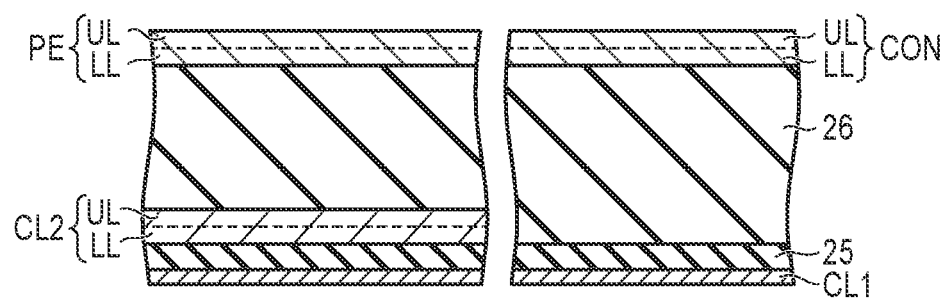
FIG. 5 is a partially sectional view showing the display panel shown in FIG. 4.

FIG. 5 is a partially sectional view showing parts of the display panel 2 shown in FIG. 4.

As shown in FIG. 5, the conductive layer CL2, the pixel electrode PE, and the contact electrode CON have a two-layer stacked structure. The conductive layer CL2, the pixel electrode PE, and the contact electrode CON include a lower layer LL formed of Ti or a Ti alloy and an upper layer UL formed of Al or an Al alloy.

Figure 6:
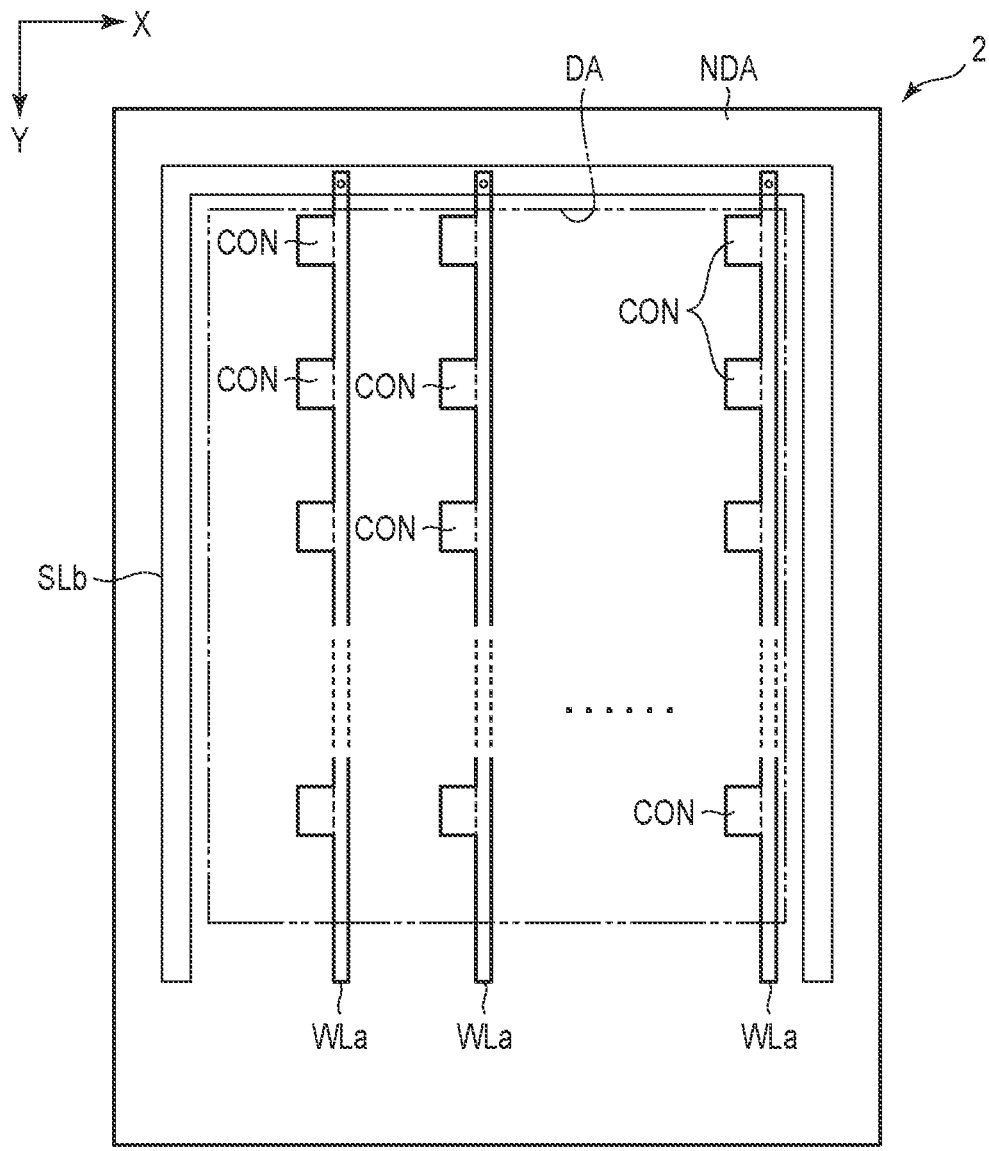
FIG. 6 is a plan view showing the display panel, illustrating a second power line, a plurality of contact electrodes, and a plurality of wiring lines.

FIG. 6 is a plan view showing the display panel 2, illustrating a second power line SLb, a plurality of contact electrodes CON, and a plurality of wiring lines WLa.

As shown in FIG. 6, the second power line SLb is located in the non-display area NDA. The second power line SLb is formed in a Π letter shape. The second power line SLb is provided on the upper side, the left side, and the right side of the non-display area NDA, but is not provided on the lower side where the signal line driving circuit XDR is located. The second power line SLb is provided between the insulating layer 23 and the insulating layer 24 (FIG. 4). The second power line SLb is provided in the same layer as the first power line SLa, and is formed of the same metal as the first power line SLa.

The second power line SLb may be formed of the same metal as the gate electrode GE, the conductive layer CL2, or the contact electrodes CON.

In addition, the above-described common electrode CE may further contact the second power line SLb in the non-display area NDA. In this case, the second power line SLb is desirably formed of the same metal as the first power line SLa. As a result, the wiring resistance of the second power line SLb can be suppressed to a low level, and ohmic contact can be formed between the common electrode CE and the second power line SLb.

Each of the plurality of wiring lines WLa is located in the display area DA and the non-display area NDA. The plurality of wiring lines WLa are electrically connected to the second power line SLb in the non-display area NDA. The plurality of wiring lines WLa, each extending in the second direction Y, are arranged at intervals in the first direction X and electrically connected to the contact electrodes CON of the plurality of pixels PX arranged in the second direction Y. Based on the above, each of the light emitting elements 10 is electrically connected between the corresponding first power line SLa of the plurality of first power lines SLa and the second power line SLb. In this embodiment, the wiring lines WLa function as the first wiring lines.

Each of the plurality of wiring lines WLa, which may be arranged at intervals in the second direction Y, may extend in the first direction X, and may be electrically connected to the contact electrodes CON of the plurality of pixels PX arranged in the first direction X.

Figure 7:
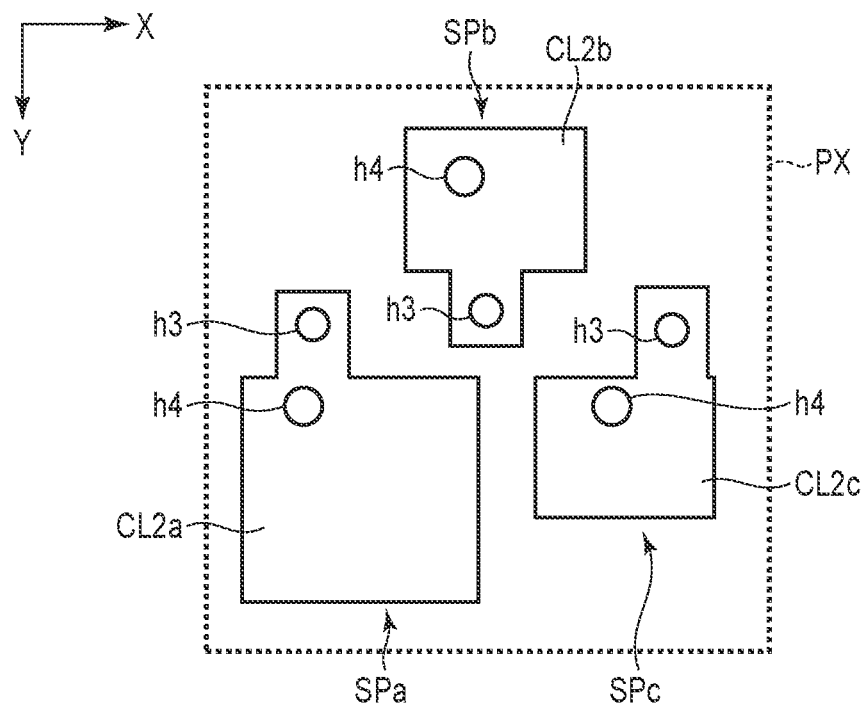
FIG. 7 is a plan view showing a pixel on the display panel, illustrating a plurality of conductive layers on the pixel.

FIG. 7 is a plan view showing a pixel PX of the display panel 2, illustrating a plurality of conductive layers CL2 of the pixel PX.

As shown in FIG. 7, each of the pixels PX includes a plurality of sub-pixels SP. In the present embodiment, the pixel PX includes sub-pixels SP of three colors, i.e., a sub-pixel SPa of a first color, a sub-pixel SPb of a second color, and a sub-pixel SPc of a third color. The sub-pixel SPa includes a conductive layer CL2a, the sub-pixel SPb includes a conductive layer CL2b, and the sub-pixel SPc includes a conductive layer CL2c.

The conductive layers CL2a, CL2b, and CL2c are provided in the same layer. The conductive layer CL2a and the conductive layer CL2c are adjacent to each other in the first direction X. The conductive layer CL2a and the conductive layer CL2c are adjacent to the conductive layer CL2b in the second direction Y. Three contact holes h3 of the pixel PX are arranged in the first direction X.

Figure 8:
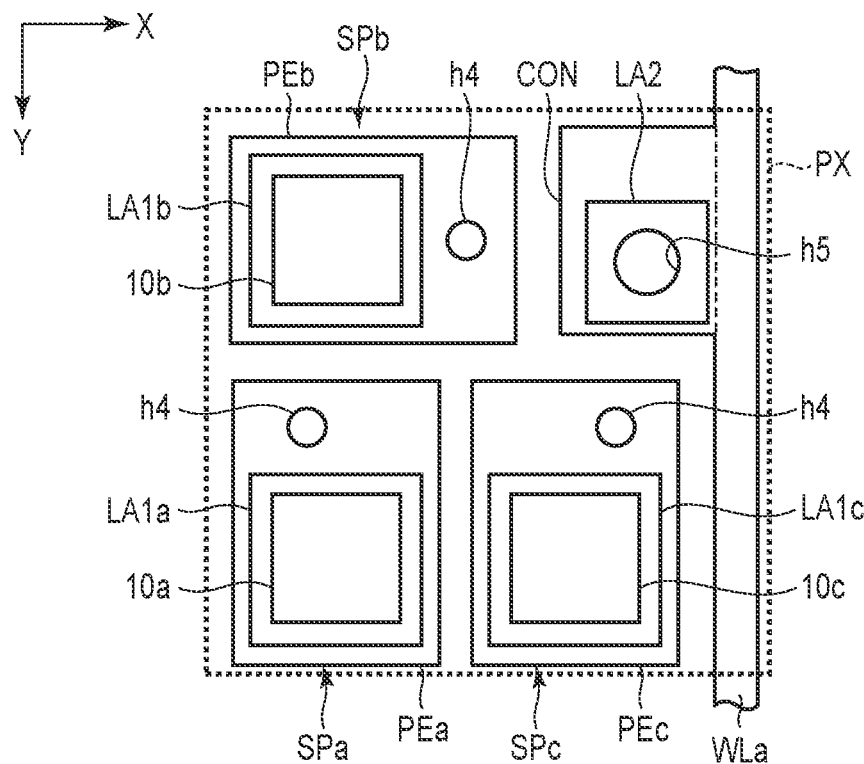
FIG. 8 is the other plan view showing the pixel on the display panel, illustrating a plurality of pixel electrodes, a plurality of connection layers, a plurality of light emitting elements, a contact electrode, a connection layer, and a wiring line on the pixel.

FIG. 8 is another plan view showing a pixel PX of the display panel 2, illustrating the plurality of pixel electrodes PE, the plurality of connection layers LA1, the plurality of light emitting elements 10, the contact electrode CON, the connection layer LA2, and the wiring line WLa, of the pixel PX.

As shown in FIG. 8, the sub-pixel SPa includes a pixel electrode PEa, a connection layer LA1a, and a light emitting element 10a. The sub-pixel SPb includes a pixel electrode PEb, a connection layer LA1b, and a light emitting element 10b. The sub-pixel SPc includes a pixel electrode PEc, a connection layer LA1c, and a light emitting element 10c.

The pixel PX includes the plurality of pixel electrodes PEa, PEb, and PEc, the plurality of connection layers LA1a, LA1b, and LA1c, the contact electrode CON, and the plurality of light emitting elements 10a, 10b, and 10c.

The plurality of pixel electrodes PEa, PEb, and PEc, the contact electrode CON, and the wiring line WLa are provided between the insulating layer 26 and the resin layer 31 and, in other words, are provided in the same layer and formed of the same metal. The wiring line WLa is electrically connected to a plurality of contact electrodes CON arranged in the second direction Y. In the present embodiment, the wiring line WLa is formed integrally with the plurality of contact electrodes CON arranged in the second direction Y.

The pixel electrode PEa and the pixel electrode PEc are adjacent to each other in the first direction X. The pixel electrode PEb and the contact electrode CON are adjacent to each other in the first direction X. The pixel electrode PEb is adjacent to the pixel electrode PEa and the pixel electrode PEc in the second direction Y. The contact electrode CON is adjacent to the pixel electrode PEc in the second direction Y.

The light emitting element 10a is adjacent to the light emitting element 10c in the first direction X and adjacent to the light emitting element 10b in the second direction Y. In planar view, the sizes of the light emitting elements 10a, 10b, and 10c are the same as each other.

According to the display device 1 of the first embodiment configured as described above, the display device 1 comprises the plurality of pixels PX, the insulating basement 20, the insulating layer 24, the insulating layer 26, the resin layer 31, the common electrode CE, and the plurality of wiring lines WLa. Each of the pixels PX includes the plurality of pixel electrodes PE, the contact electrode CON, and the plurality of light emitting elements 10. The insulating layer 24 is provided above the insulating basement 20. The insulating layer 26 is provided above the insulating layer 24. The resin layer 31 is provided on the insulating layer 26. The common electrode CE is disposed on the resin layer 31 and is formed of a transparent conductive material.

The current flowing between the anode AN and the cathode CA needs to be increased to increase the luminance of the displayed image. For this reason, the wiring resistance between the light emitting element 10 and the second power line SLb is desirably reduced.

Therefore, the plurality of pixel electrodes PE and the contact electrode CON are provided between the insulating layer 26 and the resin layer 31. Each light emitting element 10 includes the anode AN which is located on a surface of the side opposed to a corresponding pixel electrode PE of the plurality of pixel electrodes PE and which is electrically connected to the pixel electrode PE, the cathode CA located on a surface of the side opposite to the side where the anode AN is located, and the light emitting layer LI located between the anode AN and the cathode CA. The resin layer 31 is filled in the gaps between the plurality of light emitting elements 10 to expose the cathode CA of each light emitting element 10.

The common electrode CE is electrically connected to the cathodes CA of the plurality of light emitting elements 10, and is electrically connected to the contact electrodes CON of the plurality of pixels PX through the plurality of contact holes h5 formed in the resin layer 31. Each of the plurality of wiring lines WLa is provided between the insulating layer 26 and the resin layer 31, is electrically connected to the contact electrodes CON of the plurality of pixels PX, and is formed of metal.

The common electrode CE is electrically connected to the contact electrode CON for each pixel PX. The contact electrode CON is electrically connected to the wiring line WLa formed of the metal. For this reason, the wiring resistance between the light emitting element 10 and the second power line SLb can be reduced as compared with a case where the common electrode CE is in contact with the second power line SLb in the non-display area NDA. The display device 1 capable of increasing the luminance can be thereby obtained. Alternatively, the display device 1 capable of reducing the power consumption can be obtained. Alternatively, the display device 1 capable of increasing the luminance and reducing the power consumption can be obtained.

Modified Example 1 of First Embodiment

Next, the display device 1 according to a modified example 1 of the first embodiment will be described. Portions of the configuration of the display device 1 which are different from the configuration of the display device 1 of the first embodiment will be described. FIG. 9 is a plan view showing the display panel 2 according to modified example 1, illustrating the second power line SLb and the plurality of wiring lines WLa and WLb.

As shown in FIG. 9, the display panel 2 further includes a plurality of wiring lines WLb. In the modified example 1, the wiring lines WLb function as second wiring lines. Each of the plurality of wiring lines WLb is located in the display area DA and the non-display area NDA. The plurality of wiring lines WLb, each extending in the first direction X, are arranged at intervals in the second direction Y and intersect the plurality of wiring lines WLa. The plurality of wiring lines WLb are electrically connected to the contact electrodes CON of the plurality of pixels PX arranged in the first direction X. The plurality of wiring lines WLb are electrically connected to the second power line SLb in the non-display area NDA.

The plurality of wiring lines WLb are formed of a metal. In the modified example 1, each of the plurality of wiring lines WLb is provided between the insulating layer 26 and the resin layer 31. The plurality of wiring lines WLa, the plurality of wiring lines WLb, and the plurality of contact electrodes CON are provided in the same layer and are integrally formed of the same metal.

Figure 10:
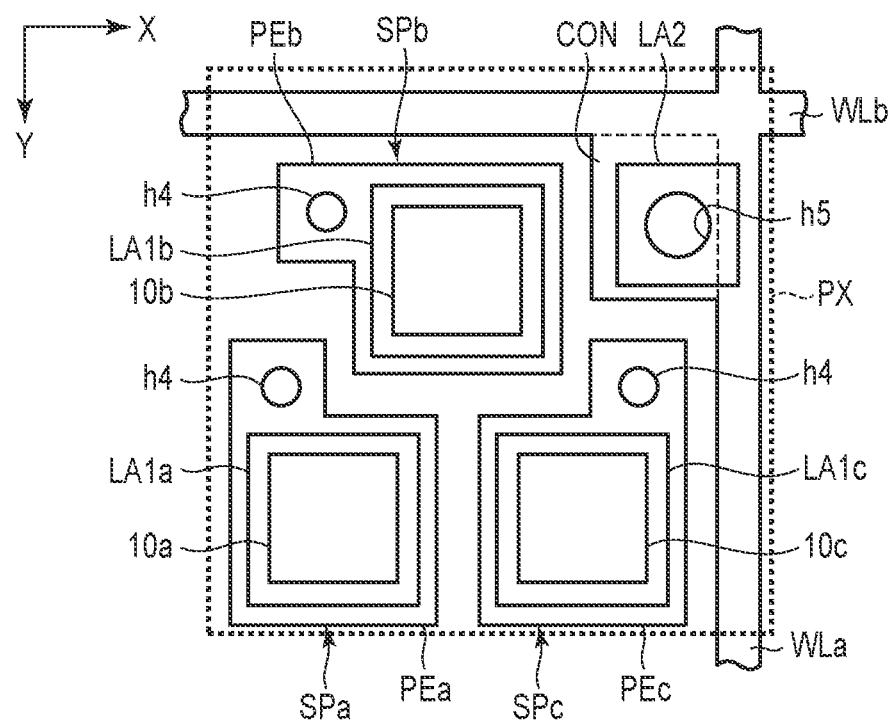
FIG. 10 is the other plan view showing the pixel on the display device according to the modified example 1, illustrating a plurality of pixel electrodes, a plurality of connection layers, a plurality of light emitting elements, a contact electrode, a connection layer, and a plurality of wiring lines on the pixel.

FIG. 10 is another plan view showing a pixel PX of the display device 1 according to the modified example 1, illustrating the plurality of pixel electrodes PE, the plurality of connection layers LA1, the plurality of light emitting elements 10, the contact electrode CON, the connection layer LA2, and the plurality of lines WLa and WLb, of the pixel PX.

As shown in FIG. 10, the size of the contact electrode CON and the size of the pixel electrode PE are the minimum sizes in planar view. The connection layer LA2 overlaps not only the contact electrode CON, but also the wiring line WLa. The light emitting element 10a and the light emitting element 10c are adjacent to each other in the first direction X. The light emitting element 10b is adjacent to the light emitting element 10a and the light emitting element 10c in the second direction Y. In planar view, the sizes of the light emitting elements 10a, 10b, and 10c are the same as each other.

In the modified example 1, the same advantages as the above-described first embodiment can also be obtained. The common electrode CE is electrically connected to the second power line SLb via not only the wiring line WLa, but also the wiring line WLb. For this reason, the wiring resistance between the light emitting element 10 and the second power line SLb can be further reduced.

Modified Example 2 of First Embodiment

Figure 11:
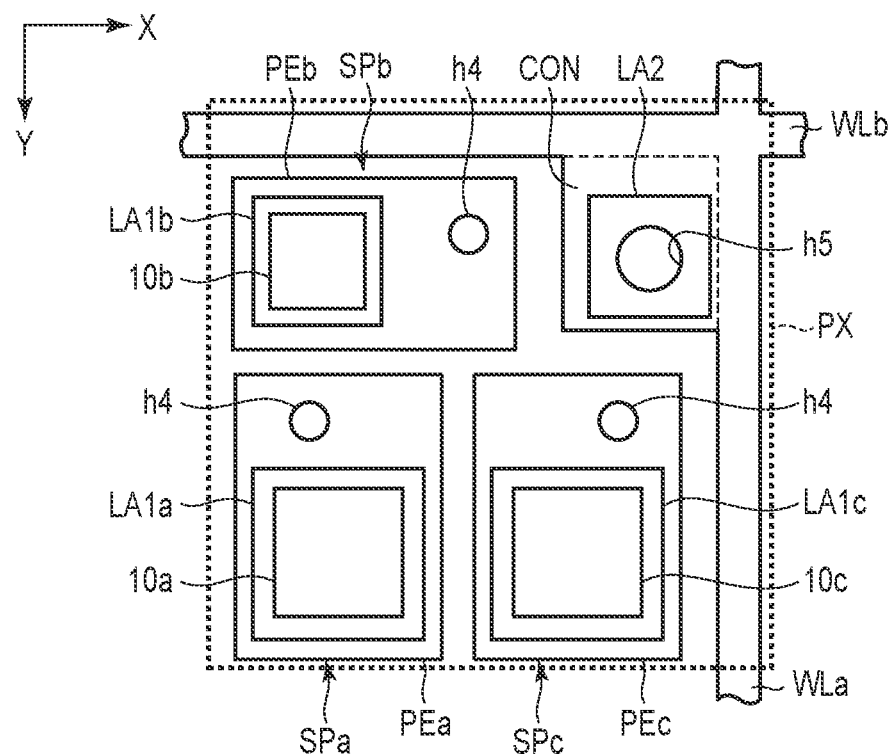
FIG. 11 is the other plan view showing the pixel on the display device according to modified example 2 of the first embodiment, illustrating a plurality of pixel electrodes, a plurality of connection layers, a plurality of light emitting elements, a contact electrode, a connection layer, and a plurality of wiring lines on the pixel.

Next, the display device 1 according to a modified example 2 of the first embodiment will be described. Portions of the configuration of the display device 1 which are different from the configuration of the display device 1 of the first embodiment will be described. FIG. 11 is another plan view showing a pixel PX of the display device 1 according to the modified example 2, illustrating the plurality of pixel electrodes PE, the plurality of connection layers LA1, the plurality of light emitting elements 10, the contact electrode CON, the connection layer LA2, and the plurality of wiring lines WLa and WLb, of the pixel PX.

As shown in FIG. 11, the display panel 2 further comprises the plurality of wiring lines WLb. In planar view, the size of the light emitting element 10b is smaller than the size of the light emitting element 10a and smaller than the size of the light emitting element 10c. In accordance with the size of the light emitting element 10b, the size of the connecting layer LA1b is smaller than the size of each of the connecting layers LA1a and LA1c in planar view. In addition, the size of the pixel electrode PEb is smaller than the size of each of the pixel electrodes PEa and PEc, in planar view.

The size of the contact electrode CON is the same as that of the first embodiment, and the connection layer LA2 overlaps only the contact electrode CON.

In the modified example 2, the same advantages as the above-described first embodiment can also be obtained.

Second Embodiment

Figure 12:
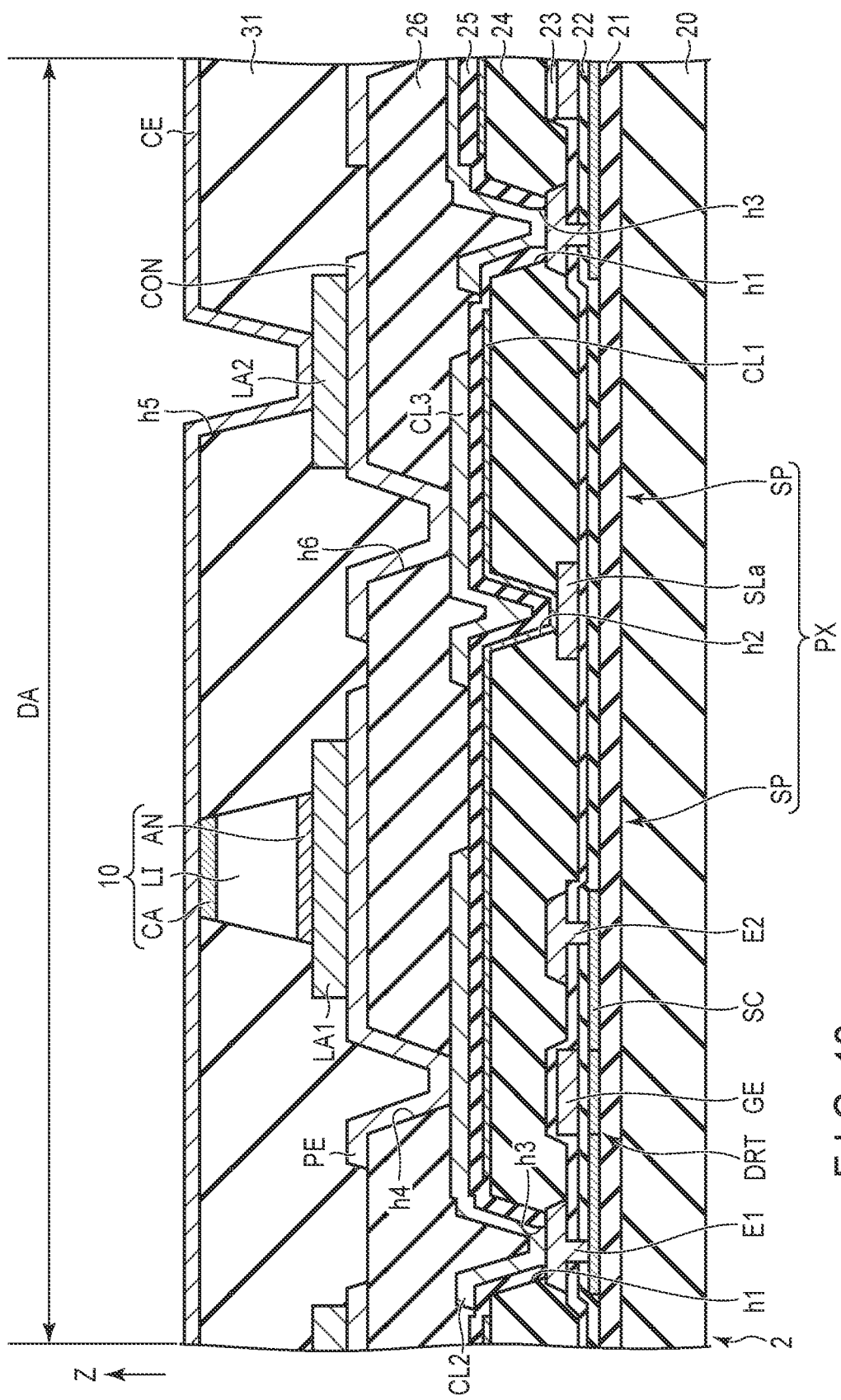
FIG. 12 is a partially sectional view showing a display panel of a display device according to a second embodiment.

Next, a display device 1 according to a second embodiment will be described. Portions of the configuration of the display device 1 which are different from the configuration of the display device 1 of the first embodiment will be described. FIG. 12 is a partially sectional view showing a display panel 2 of the display device 1 according to the second embodiment.

As shown in FIG. 12, the display panel 2 further includes a conductive layer CL3. The conductive layer CL3 is located between the insulating layer 24 and the insulating layer 26. In the present embodiment, the conductive layer CL3 is provided on the insulating layer 25 and is covered with the insulating layer 26. The conductive layer CL3 is formed of a metal. In the present embodiment, the conductive layer CL3 is formed of the same metal as the conductive layer CL2.

A contact hole h6 through which the conductive layer CL3 is exposed is formed in the insulating layer 26. The contact electrode CON is in contact with the conductive layer CL3 through the contact hole h6, and is electrically connected to the conductive layer CL3.

The wiring lines WLa and WLb are not located between the insulating layer 26 and the resin layer 31, unlike the above-described first embodiment. In the present embodiment, the wiring lines WLa and WLb are located between the insulating layer 24 and the insulating layer 26. The wiring lines WLa and WLb are provided in the same layer as the conductive layer CL3 and are formed of the same metal.

FIG. 13 is a plan view showing the display panel 2 according to the second embodiment, illustrating a second power line SLb, a plurality of conductive layers CL3, and a plurality of wiring lines WLa and WLb.

As shown in FIG. 13, the plurality of wiring lines WLa and WLb are integrally formed of the same metal as the plurality of conductive layers CL3. The plurality of wiring lines WLa and WLb are formed in a grating pattern in the display area DA, and are electrically connected to the second power line SLb in the non-display area NDA.

Figure 14:
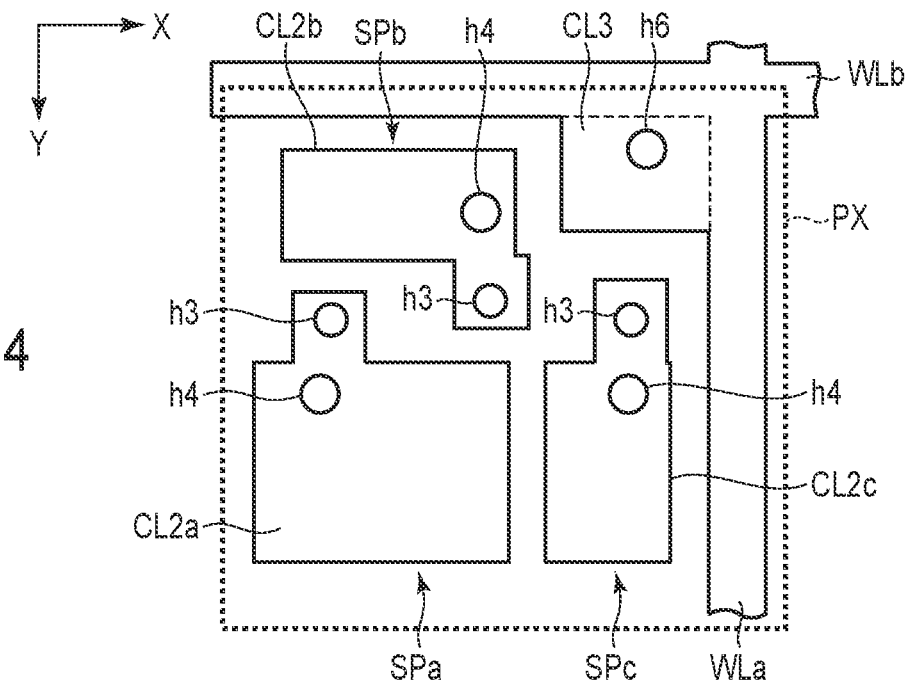
FIG. 14 is a plan view showing a pixel on the display panel according to the second embodiment, illustrating a plurality of conductive layers, a plurality of wiring lines, and a conductive layer on the pixel.

FIG. 14 is a plan view showing a pixel PX on the display panel 2 according to the second embodiment, illustrating a plurality of conductive layers CL2, the plurality of wiring lines WLa and WLb, and the conductive layer CL3, of the pixel PX.

As shown in FIG. 14, the conductive layers CL2a, CL2b, and CL2c, the conductive layer CL3, and the wiring lines WLa and WLb are provided in the same layer. The conductive layer CL3 is adjacent to the conductive layer CL2b in the first direction X and is adjacent to the conductive layer CL2c in the second direction Y. The conductive layer CL3 is formed integrally with the wiring lines WLa and WLb.

Figure 15:
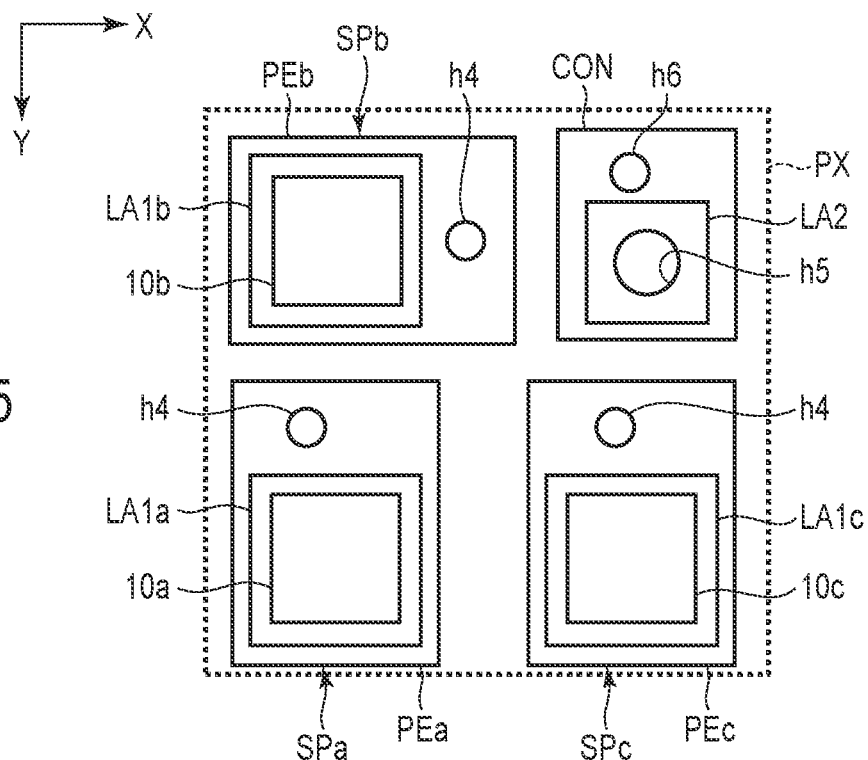
FIG. 15 is the other plan view showing the pixel on the display panel according to the second embodiment, illustrating a plurality of pixel electrodes, a plurality of connection layers, a plurality of light emitting elements, a contact electrode, and a connection layer, on the pixel.

FIG. 15 is another plan view showing a pixel PX of the display panel 2 according to the second embodiment, illustrating the plurality of pixel electrodes PE, the plurality of connection layers LA1, the plurality of light emitting elements 10, the contact electrode CON, and the connection layer LA2, of the pixel PX.

As shown in FIG. 15, the contact electrode CON is adjacent to the pixel electrode PEb in the first direction X and is adjacent to the pixel electrode PEc in the second direction Y. In planar view, the contact hole h6 overlaps the contact electrode CON, but is located away from the connection layer LA2.

According to the display device 1 according to the second embodiment configured as described above, the wiring lines WLa and WLb may be provided between the insulating layer 24 and the insulating layer 26. The same advantages as those of the first embodiment can also be obtained in the second embodiment. For this reason, the display device 1 capable of increasing the luminance can be obtained. Alternatively, the display device 1 capable of reducing the power consumption can be obtained. Alternatively, the display device 1 capable of increasing the luminance and reducing the power consumption can be obtained.

Third Embodiment

Figure 16:
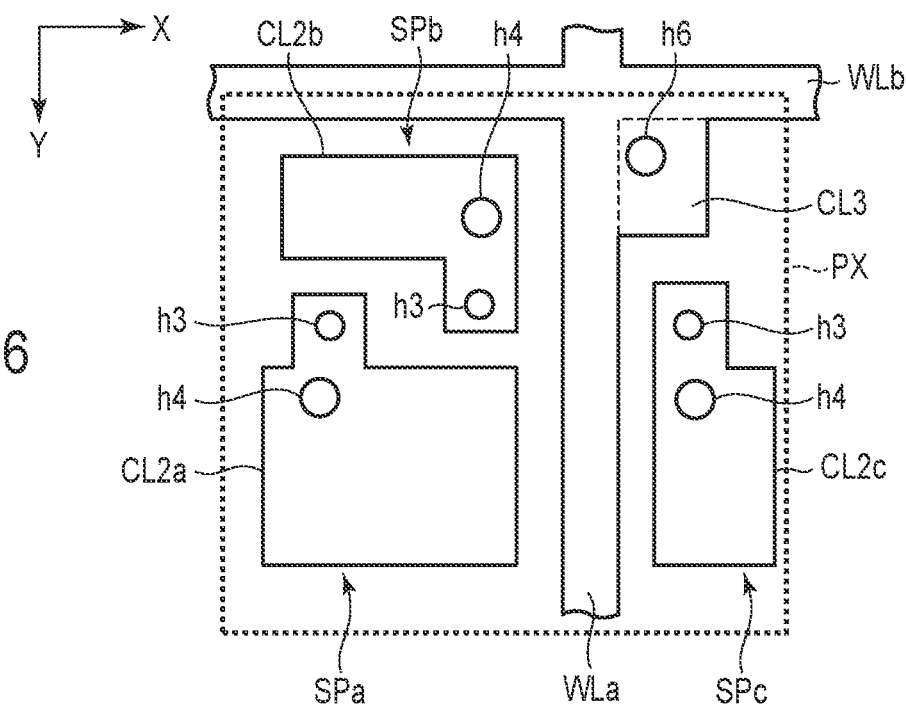
FIG. 16 is a plan view showing a pixel on a display panel according to a third embodiment, illustrating a plurality of conductive layers, a plurality of wiring lines, and a conductive layer on the pixel.

Next, a display device 1 according to a third embodiment will be described. Portions of the configuration of the display device 1 which are different from the configuration of the display device 1 of the second embodiment will be described. FIG. 16 is a plan view showing a pixel PX on the display panel 2 according to the third embodiment, illustrating a plurality of conductive layers CL2, a plurality of wiring lines WLa and WLb, and a conductive layer CL3, of the pixel PX.

As shown in FIG. 16, a group of the conductive layer CL2a and the conductive layer CL2b and a group of the conductive layer CL2c and the conductive layer CL3 may be located with the wiring line WLa sandwiched therebetween, in the same pixel PX. The conductive layer CL3 is integrally formed of the same metal as the wiring lines WLa and WLb.

Figure 17:
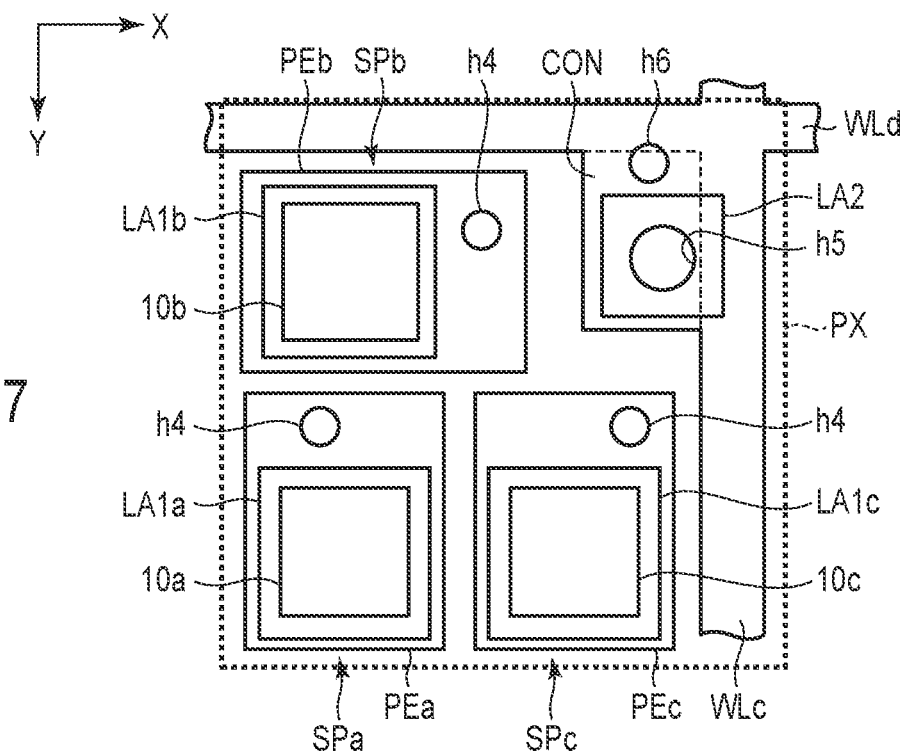
FIG. 17 is the other plan view showing the pixel on the display panel according to the third embodiment, illustrating a plurality of pixel electrodes, a plurality of connection layers, a plurality of light emitting elements, a contact electrode, a connection layer, and a plurality of wiring lines, on the pixel.

FIG. 17 is another plan view showing a pixel PX of the display panel 2 according to the third embodiment, illustrating the plurality of pixel electrodes PE, the plurality of connection layers LA1, the plurality of light emitting elements 10, the contact electrode CON, the connection layer LA2, and the wiring lines WLc and WLd, of the pixel PX.

As shown in FIG. 17, the display panel 2 comprises the wiring lines WLc and WLd in addition to the wiring lines WLa and WLb. The wiring lines WLc and WLd are provided on the same layer as the pixel electrode PE and the contact electrode CON, and are formed of the same metal. The wiring lines WLc and WLd are formed integrally with the contact electrode CON. The wiring lines WLc and WLd are located in the display area DA and the non-display area NDA.

The plurality of wiring lines WLc, each extending in the second direction Y, are arranged at intervals in the first direction X and electrically connected to the contact electrodes CON of the plurality of pixels PX arranged in the second direction Y. The plurality of lines WLd, each extending in the first direction X, are arranged at intervals in the second direction Y and electrically connected to the contact electrodes CON of the plurality of pixels PX arranged in the first direction X.

In the non-display area NDA, the wiring lines WLc and WLd are connected to the second power line SLb. In the present embodiment, the wiring line WLc functions as a third wiring line, and the line WLd functions as a fourth wiring line. The connection layer LA2 overlaps not only the contact electrode CON, but also the wiring line WLc.

According to the display device 1 of the third embodiment configured as described above, the display panel 2 may further comprise the wiring lines WLc and WLd. The same advantages as those of the above-described embodiments can also be obtained from the third embodiment. Then, the wiring resistance between the light emitting element 10 and the second power line SLb can be desirably reduced as the wiring lines WLc and WLd are added. For this reason, the display device 1 capable of increasing the luminance can be obtained. Alternatively, the display device 1 capable of reducing the power consumption can be obtained. Alternatively, the display device 1 capable of increasing the luminance and reducing the power consumption can be obtained.

Fourth Embodiment

Next, a display device 1 according to a fourth embodiment will be described. Portions of the configuration of the display device 1 which are different from the configuration of the display device 1 of the second embodiment will be described.

Figure 18:
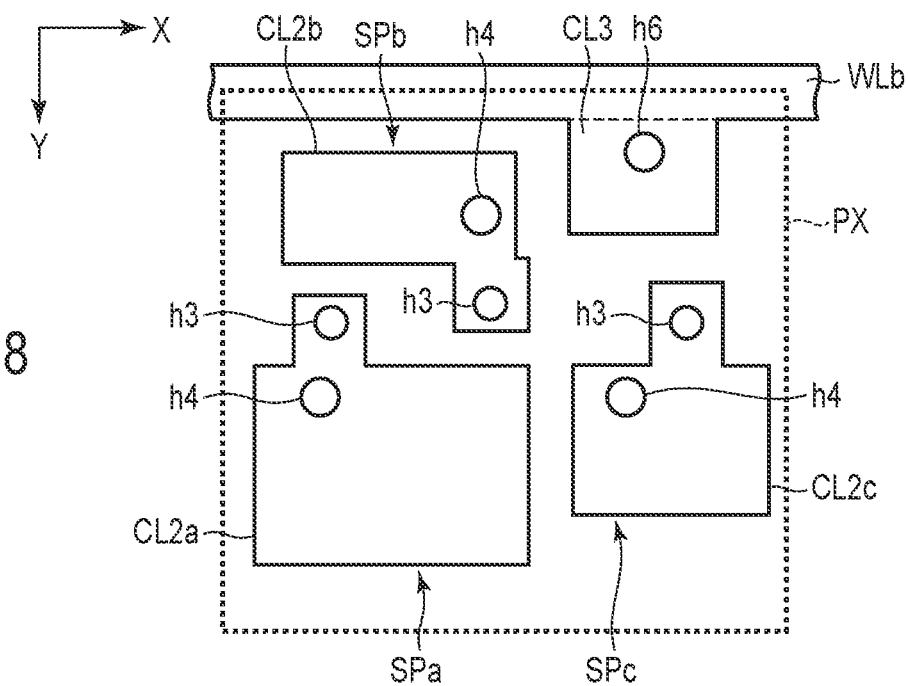
FIG. 18 is a plan view showing a pixel on a display panel according to a fourth embodiment, illustrating a plurality of conductive layers, a wiring line, and a conductive layer on the pixel.

FIG. 18 is a plan view showing a pixel PX of the display panel 2 according to the fourth embodiment, illustrating a plurality of conductive layers CL2, a wiring line WLb, and a conductive layer CL3, of the pixel PX. As shown in FIG. 18, the wiring line WLa may not be provided in the same layer as the plurality of conductive layers CL2, the wiring line WLb, and the conductive layer CL3. The wiring line WLa is not formed integrally with the conductive layer CL3 and the wiring line WLb. The fourth embodiment is different from the second embodiment (FIG. 14) in the above-described points.

Figure 19:
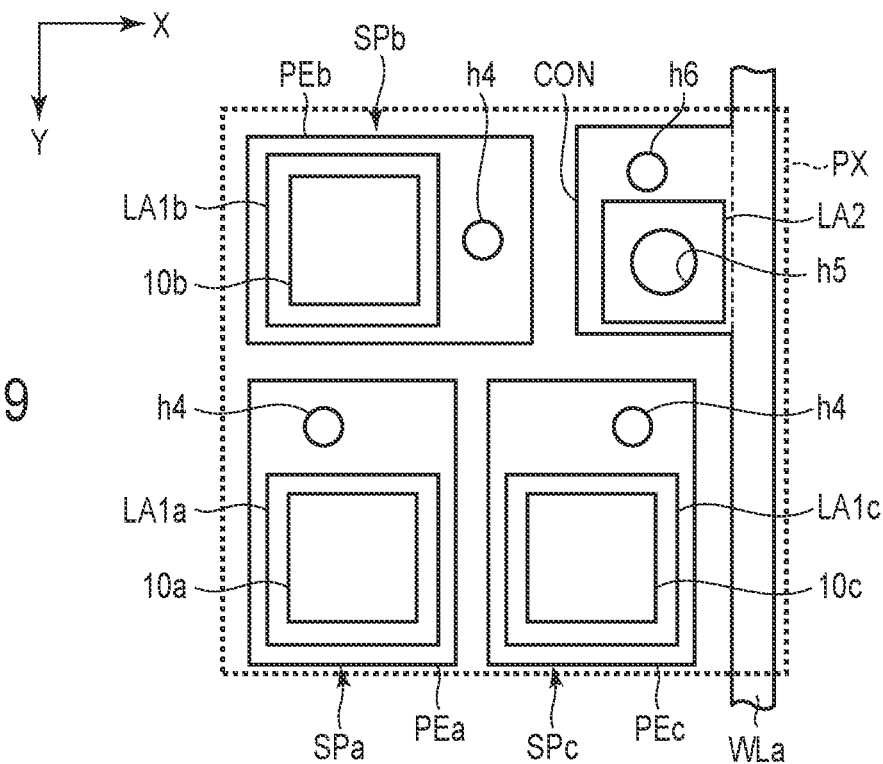
FIG. 19 is the other plan view showing the pixel on the display panel according to the fourth embodiment, illustrating a plurality of pixel electrodes, a plurality of connection layers, a plurality of light emitting elements, a contact electrode, a connection layer, and a wiring line, on the pixel.

FIG. 19 is another plan view showing a pixel PX of the display panel 2 according to the fourth embodiment, illustrating the plurality of pixel electrodes PE, the plurality of connection layers LA1, the plurality of light emitting elements 10, the contact electrode CON, and the connection layer LA2, and the wiring line WLa, of the pixel PX. As shown in FIG. 19, the wiring line WLa is provided in the same layer as the plurality of pixel electrodes PE and the contact electrode CON. The wiring line WLa is integrally formed of the same material as the contact electrode CON. The fourth embodiment is different from the second embodiment (FIG. 15) in the above-mentioned points.

According to the display device 1 of the fourth embodiment configured as described above, the wiring line WLb may be located between the insulating layer 24 and the insulating layer 26, and the wiring line WLa may be located between the insulating layer 26 and the resin layer 31. The same advantages as those of the second embodiment can also be obtained from the fourth embodiment.

The positions of the wiring lines WLa and WLb may be different from those of the fourth embodiment. For example, the wiring line WLa extending in the second direction Y may be located between the insulating layer 24 and the insulating layer 26 and may be formed integrally with the conductive layer CL3. In this case, the wiring line WLb extending in the first direction X may be located between the insulating layer 26 and the resin layer 31 and may be formed integrally with the contact electrode CON.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a plurality of pixels each including a plurality of transistors, a plurality of pixel electrodes, a contact electrode, and a plurality of light emitting elements;
an insulating basement;
a first organic insulating layer provided above the insulating basement to cover the transistors;
a second organic insulating layer provided above the first organic insulating layer;
a resin layer provided on the second organic insulating layer;
a common electrode disposed on the resin layer; and
a plurality of first wiring lines, wherein
the plurality of pixel electrodes and the contact electrode being provided between the second organic insulating layer and the resin layer,
each of the light emitting elements including a first polar electrode located on a surface opposed to a corresponding pixel electrode of the plurality of pixel electrodes and electrically connected to the pixel electrode, and a second polar electrode located on a surface opposite to the surface where the first polar electrode is located,
the second polar electrode of each of the light emitting elements being exposed from the resin layer,
the common electrode being electrically connected to the second polar electrodes of the plurality of light emitting elements, and being electrically connected to the contact electrodes of the plurality of pixels through the plurality of first contact holes formed in the resin layer, and
the plurality of first wiring lines, each provided between the first organic insulating layer and the second organic insulating layer or between the second organic insulating layer and the resin layer, being electrically connected to the contact electrodes of the plurality of pixels, and being formed of a metal.

2. The display device of claim 1, wherein
the contact electrodes are formed of a metal,
each of the pixels further includes a connection layer disposed on the contact electrode and formed of solder, and
the common electrode is in contact with the connection layers of the plurality of pixels through the plurality of first contact holes.

3. The display device of claim 2, wherein
the contact electrode includes an uppermost layer located on a side opposed to the common electrode and formed of aluminum or an aluminum alloy, and
the connection layer is in contact with the uppermost layer.

4. The display device of claim 2, wherein
the plurality of pixels are arrayed in a matrix in a first direction and a second direction intersecting each other, and
the plurality of first wiring lines, each extending in the first direction, are arranged at intervals in the second direction and electrically connected to the contact electrodes of the plurality of pixels arranged in the first direction or, each extending in the second direction, are arranged at intervals in the first direction and electrically connected to the contact electrodes of the plurality of pixels arranged in the second direction.

5. The display device of claim 4, wherein
the plurality of first wiring lines are provided between the second organic insulating layer and the resin layer and integrally formed of a same metal as the plurality of contact electrodes.

6. The display device of claim 4, further comprising:
a plurality of second wiring lines each provided between the first organic insulating layer and the second organic insulating layer or between the second organic insulating layer and the resin layer, and formed of a metal, wherein
the plurality of first wiring lines, each extending in the second direction, are arranged at intervals in the first direction and electrically connected to the contact electrodes of the plurality of pixels arranged in the second direction, and
the plurality of second wiring lines, each extending in the first direction, are arranged at intervals in the second direction, intersect the plurality of first wiring lines, and are electrically connected to the contact electrodes of the plurality of pixels arranged in the first direction.

7. The display device of claim 6, wherein
the plurality of first wiring lines and the plurality of second wiring lines are provided in a same layer and integrally formed of a same metal.

8. The display device of claim 6, wherein
the plurality of first wiring lines are provided between the second organic insulating layer and the resin layer, and
the plurality of second wiring lines are provided between the first organic insulating layer and the second organic insulating layer.

9. The display device of claim 7, wherein
the plurality of first wiring lines and the plurality of second wiring lines are provided between the second organic insulating layer and the resin layer and integrally formed of a same metal as the plurality of contact electrodes.

10. The display device of claim 1, further comprising:
a display area where the plurality of pixels are arrayed in a matrix in a first direction and a second direction intersecting each other;
a non-display area outside the display area;
a plurality of first power lines located in the display area, extending in the second direction, and arranged at intervals in the first direction; and
a second power line located in the non-display area and set to a potential different from a potential of the plurality of first power lines,
wherein
each of the plurality of first wiring lines is located in the display area and the non-display area, and electrically connected to the second power line in the non-display area, and
each of the light emitting elements is electrically connected between a corresponding first power line of the plurality of first power lines and the second power line.

11. The display device of claim 10, further comprising:
a plurality of second wiring lines each provided between the first organic insulating layer and the second organic insulating layer or between the second organic insulating layer and the resin layer, and formed of a metal, wherein
the plurality of first wiring lines, each extending in the second direction, are arranged at intervals in the first direction and electrically connected to the contact electrodes of the plurality of pixels arranged in the second direction, and
the plurality of second wiring lines, each extending in the first direction, are arranged at intervals in the second direction, intersect the plurality of first wiring lines, are electrically connected to the contact electrodes of the plurality of pixels arranged in the first direction, are located in the display area and the non-display area, and are electrically connected to the second power line in the non-display area.

12. The display device of claim 10, wherein
the plurality of pixels include a plurality of sub-pixels each including a pixel electrode of the plurality of pixel electrodes and a light emitting element of the plurality of light emitting elements,
each of the sub-pixels further includes a drive transistor that is the transistor provided above the insulating basement and covered with the first organic insulating layer, and
in each of the sub-pixels, the drive transistor and the light emitting element are serially connected between the first power line and the second power line.

* * * * *